United States Patent
Parks et al.

(10) Patent No.: US 9,865,383 B2
(45) Date of Patent: Jan. 9, 2018

(54) SYSTEMS AND METHODS FOR ACTIVATION OF TRAPPED FIELD MAGNETS

(71) Applicant: NATIONAL OILWELL VARCO, L.P., Houston, TX (US)

(72) Inventors: Drew Paul Parks, Houston, TX (US); Roy Weinstein, Houston, TX (US); Ravi-Persad Sawh, Missouri City, TX (US); Keith Carpenter, Houston, TX (US)

(73) Assignee: NATIONAL OILWELL VARCO, L.P., Houston, TX (US)

( * ) Notice: Subject to any disclaimer, the term of this patent is extended or adjusted under 35 U.S.C. 154(b) by 0 days.

(21) Appl. No.: 15/112,883

(22) PCT Filed: Jan. 21, 2015

(86) PCT No.: PCT/US2015/012232
§ 371 (c)(1),
(2) Date: Jul. 20, 2016

(87) PCT Pub. No.: WO2015/156883
PCT Pub. Date: Oct. 15, 2015

(65) Prior Publication Data
US 2016/0336102 A1   Nov. 17, 2016

Related U.S. Application Data

(60) Provisional application No. 61/929,982, filed on Jan. 22, 2014.

(51) Int. Cl.
*H01F 6/00* (2006.01)
*H01L 39/12* (2006.01)

(52) U.S. Cl.
CPC .............. *H01F 6/006* (2013.01); *H01F 6/00* (2013.01); *H01L 39/126* (2013.01)

(58) Field of Classification Search
CPC .................................. H01F 6/00; H01F 6/006
See application file for complete search history.

(56) References Cited

U.S. PATENT DOCUMENTS

| | | |
|---|---|---|
| 3,940,643 A | 2/1976 | Sika et al. |
| 5,306,701 A | 4/1994 | Israelsson et al. |
| 5,659,278 A | 8/1997 | Yanagi et al. |

(Continued)

FOREIGN PATENT DOCUMENTS

WO    2014058790 A1    4/2014

OTHER PUBLICATIONS

International Search Report for corresponding International Patent Application No. PCT/US2015/012232, dated Mar. 29, 2016.

(Continued)

*Primary Examiner* — Ramon M Barrera
(74) *Attorney, Agent, or Firm* — Jones Robb, PLLC

(57) ABSTRACT

A system for activating trapped field magnets in a superconducting material may include a superconducting material element and an electromagnet source disposed proximate the superconducting material element. The electromagnet source may be configured to produce a magnetic field pulse sufficient to activate the superconducting material element. The superconducting material element may be configured to retain a trapped magnetic field that is substantially equal to a magnetic field generated by the magnetic field pulse.

28 Claims, 17 Drawing Sheets

(56) References Cited

U.S. PATENT DOCUMENTS

| | | | |
|---|---|---|---|
| 6,083,885 | A | 7/2000 | Weinstein |
| 6,525,002 | B1 | 2/2003 | Weinstein |
| 6,621,395 | B1 | 9/2003 | Bromberg |
| 7,026,901 | B2 | 4/2006 | Yanagi et al. |
| 7,498,915 | B1 | 3/2009 | Leupold |
| 7,667,562 | B1 | 2/2010 | Weinstein |
| 2001/0013818 | A1 | 8/2001 | Young |
| 2015/0294776 | A1 | 10/2015 | Parks et al. |

OTHER PUBLICATIONS

Written Opinion for corresponding International Patent Application No. PCT/US2015/012232, dated Mar. 29, 2016.
International Search Report for related International Patent Application No. PCT/US2013/63710, dated Feb. 28, 2014.
Written Opinion for related International Patent Application No. PCT/US2013/63710, dated Feb. 28, 2014.
C.P. Bean, "Magnetization of High-Field Superconductors," Rev. Mod. Phys. 36, pp. 31-39 (1964).
Roy Weinstein, Drew Parks, Ravi-Persad Sawh, and Kent Davey, "Characteristics of trapped field magnet activation by flux pumping." IEEE Trans. Appl. Supercond., vol. 21, No. 3, part II, pp. 2436-2440, Jun. 2011.
Drew Parks, Roy Weinstein, Kent Davey, Ravi-Persad Sawh, and Bill Mayes, "The effect of a ferromagnetic medium on the field of YBCO trapped field magnets," IEEE Trans. Appl. Supercond., vol. 19, No. 3, pp. 2937-2940, 2009.
M. Sander, U. Sutter, M. Adam and M. Klaeser, "Comparison of pulsed magnetization process for HTS bulk parts," Supercond. Sci. Technol., vol. 15, pp. 748-753, 2002.
R. Liang, P. Dosanjh, D. A. Bonn, and W. Hardy, "Lower critical fields in an ellipsoid-shaped YBa2Cu3O6.95 single crystal," Phys Rev. B, vol. 50, pp. 4212-4215, 1994.
S. Braeck, D. Shantsev, T. Johansen and Y. Galperin, "Superconducting trapped field magnets: temperature and field distributions during pulsed field activation," Jour. Appl. Phys., vol. 92, pp. 6235-6240, 2002.
D. Parks, R. Weinstein, K. Davey, and R. Sawh, "A study of pulsed activation of trapped field magnets—Part 1: effects of pulse height and creep," IEEE Trans. Appl. Supercond. 23 6800205, 2013.
R. Weinstein et al., "Properties of HTS for successful U/n processing," Physica C 341-348, pp. 1415-1418, 2000.
R. Weinstein, "An overview of U/n processing," Advances in Superconductivity XII ed T, Yamashita and K Tanabe (Tokyo: Springer-Verlag), pp. 521-526, 2000.
M. Strasik, J. R. Hull, J. A. Mittleider, J. F. Gonder, P. E Johnson, K. E. McCrary and C. R. McIver, 2010, An overview of Boeing flywheel energy storage systems with high-temperature superconducting bearings, Supercond. Sci. Technol., 23 034021, 2010.
M. Miki et al., "Development of a synchronous motor with GdBCO bulk superconductors as pole field magnets for propulsion system," Supercond. Sci. Technol. 19 S494, 2006.
X. Feng, G. Gao, K. Davey, M. Werst, R. Hebner, R. Weinstein, D. Parks and R. Sawh, "Radial flux high temperature superconductor motor using bulk trapped field magnets," IEEE Int. Electric Machines & Drives Conf., Miami, FL May 2009, pp. 458-464.
B. Oswald, M. Krone, M. Soli, T. Strasser, J. Oswald, K. Best, W. Gawalek and L. Kovalev, "Superconducting reluctance motors with YBCO bulk material," IEEE Transactions in Applied Superconductivity, vol. 9, pp. 1201-1204, Jun. 1999.
R. Weinstein, D. Parks, R. Sawh and K. Davey, "Measurements of flux pumping activation of trapped field magnets Supercond.," Sci. Technol., 23 115015, 2010.
K. Davey, R. Weinstein, D. Parks, and R. Sawh, "Activation of trapped field magnets by flux pumping," IEEE Transactions on Magnetics, 47 pp. 1090-1093, 2011.
K. Davey, R. Weinstein, D. Parks and R. Sawh, "Simulating the trapped B field in bulk superconductors using a mutual nductance coupling technique," IEEE Trans. Magn., 49 pp. 1153-1158, 2013.
Z. Xu, R. Lewin, A. M. Campbell, D. A. Cardwell and H. Jones, "Simulation studies on the magnetization of (RE)BCO bulk superconductors using various split coil arrangements," Supercond. Sci. Technol., 25 025016, 2012.
Z. Deng, M. Miki, B. Felder, K. Tsuzuki, N. Shinohara, R. Taguchi, K. Suzuki and M. Izumi, "The effectiveness of pulsed-field magnetization with respect to different performance bulk superconductors." J. Supercond. Nov. Magn., 25 pp. 61-66, 2012.
R. Das, Z. Islam, J. Ruff, R. Sawh, R. Weinstein, J. Kim, P. Canfield and J. Lang, "A novel approach for x-ray scattering experiments in magnetic fields utilizing trapped flux in type-II superconductors," Rev. Sci. Instrum., 83 065103, 2012.
J. Zou, M. M Ainslie, D. Hu, D. Cardwell, "Influence of Time-Varying External Magnetic Fields on Trapped Fields in Bulk Superconductors," EEE Transactions in Applied Superconductivity, vol. 25, No. 3, Jun. 2015.
D. Yazici, M. Erdem, B. Ozcelik, "Improvement of the Intergranular Pinnning Energy in the (BiPb)2Sr2Ca2Cu2O10+δ Superconductors Doped with High Valancy Cations," J. Supercond. Nov. Magn., 25 pp. 725-729, 2012.
Y. Kimura, H. Matsuzaki, I. Ohtani, E. Morita, M. Izumi, N. Sakai, J. Hirabayashi, M. Miki, M. Kitano, T. Ida, Supercond. Sci. Technol. 19, S466, 2006.
R. P. Sawh, Yanru Ren, Roy Weinstein, Wolfgang Hennig and Takayuki Nemoto, "Uranium Chemistry and Pinning Centers in HTS," Physica C 305, 159,1998.
Roy Weinstein, Ravi Sawh, Yanru Ren, Michael Eisterer, Harald W. Weber, "The role of uranium chemistry and uranium fission in obtaining ultra-high Jc in textured Y123." Supercond. Sci. Technol. 11, 959, 1998.
D. R. Nelson, "Vortex entanglement in high-Tc superconductors," Phys. Rev. Lett. 60, 1973,1988.
Y. Ren, R. Weinstein, J. Liu, and R. P. Sawh, C. Foster, "Damage Caused by Magnetic Pressure at High Trapped Field in Quasi-Permanent Magnets Composed of Melt-Textured YBaCuO Superconductor," Physica C 251, 15,1995.
Roy Weinstein, Alberto Gandini, Ravi-Persad Sawh, Bill Mayes, and Drew Parks, "Experimental test of the postulate that continuous columnar pinning centers produce the highest Jc," Phys. Lett. A 331, pp. 276-280, 2004.
Roy Weinstein, Drew Parks, Ravi-Persad Sawh, Kent Davey and Keith Carpenter "A study of pulsed activation of trapped field magnets—Part II: effects of multiple pulsing." Supercond. Sci. Technol. 26, 095005, 2013.
R.-P. Sawh, R. Weinstein, D.Parks, A. Gandini, Y. Ren, and I. Rusakova, "Tungsten and Molybdenum Double Perovskites as Pinning Centers in Melt-Textured Y123," Physica C, vol. 383/4, pp. 411-416, Jan. 2003.
Roy Weinstein, Ravi-Persad Sawh, Drew Parks, Bill Mayes, "Improvement of high Tc superconductor by near-optimum pinning centers created by high Z, high-energy ions." Nuclear Instruments and Methods in Physics Research B, vol. 272 pp. 284-290, Jan. 2012.
R. Weinstein, D. Parks, R.-P. Sawh, B. Mayes, A. Gandini, A. Goyal, Y. Chen, V. Selvamanickam, "Effects on Jc of pinning center morphology for multiple-in-line-damage in coated conductor and bulk, melt-textured HTS." Invited journal paper, Physica C 469, pp. 2068-2076, Dec. 2009.
Extended European Search Report for related European Application No. 13845380.8, dated May 3, 2016.
Hiroyuki Fujishiro, Tomoyuki Naito, and Mitsuru Oyama, "Mechanism of magnetic flux trapping on superconducting bulk magnetized by pulsed field using a vortex-type coil," Supercond. Sci. Technol. 24, 075015, 2011.
E Morita, H Matsuzaki, Y Kimura, H Ogata, M Izumi, T Ida, M Murakami, H Sugimoto, and M Miki, "Study of a new split-type magnetizing coil and pulsed field magnetization of Gd—Ba—Cu—O high temperature superconducting bulk for rotating machinery application," Supercond. Sci. Technol. 19, pp. 1259-1263, 2006.

(56) References Cited

OTHER PUBLICATIONS

K Yamaguchi et al., "Pulsed Field Magnetization Properties for a Large Single-grain Gd—Ba—Cu—O High-Temperature Superconductor Bulk with a Diameter of 140 mm by using a New Type of Pulsed Copper Split Coil," Journal of Physics: Conference Series, 97, 012278, 2008.
Non-Final Office Action dated Sep. 16, 2016, in co-pending U.S. Appl. No. 14/432,705.
E Morita, H Matsuzaki, Y Kimura, I Ohtani, H Ogata, M Izumi, Y Nonaka, M Murakami, T Ida, H Sugimoto, M Miki and M Kitano, "Study of single pulsed-field magnetization of Gd—Ba—Cu—O bulk high-temperature superconductor with a split type of armature coil for rotating machinery," Supercond. Sci. Technol. 19, pp. S486-S490, 2006.
Extended European Search Report for corresponding European Patent Application No. 15776628.8, dated Aug. 25, 2017.
Ravi-Persad Sawn et al., "Production run of 2 cm diameter YBCO trapped field magnets with surface field of 2 T at 77 K", vol. 26, No. 10, Aug. 27, 2013, pp. 1-6.

SYSTEMS AND METHODS FOR ACTIVATION OF TRAPPED FIELD MAGNETS

CROSS-REFERENCE TO RELATED APPLICATIONS

This is a national stage application of PCT/US2015/012232, filed internationally on Jan. 21, 2015, which claims priority to U.S. Provisional Patent Application No. 61/929,982, filed Jan. 22, 2014 and entitled "Systems and Methods for Activation of Trapped Field Magnets," each of which is incorporated by reference herein in its entirety.

TECHNICAL FIELD

The present disclosure relates generally to the activation of superconducting trapped field magnets, and related methods and systems. The present disclosure also relates to the use of such magnets in drive applications.

INTRODUCTION

The section headings used herein are for organizational purposes only and are not to be construed as limiting the subject matter described in any way.

Magnets have numerous applications, including, for example, the ability to transfer electric energy into mechanical energy without significant energy loss. Magnets are, therefore, an important component in various technologies, including, for example, electric motors and generators. Ferromagnetic materials that create their own persistent magnetic fields are considered permanent magnets. Permanent magnets are significantly limited in the magnitude of magnetic field which they can supply. Additionally, the permanent magnets of highest magnet fields are composed of materials that are relatively rare and sometimes found in only limited geographical areas around the world. Accordingly, permanent magnets are expensive and can be cost prohibitive for use in various applications.

Furthermore, conventional permanent magnet motors and generators have power constraints, in which the amount of power that can be delivered is limited by the size and weight of the motor/generator. This leads to constraints on size and/or weight design parameters that can be unduly limiting. In general, shrinking the size of permanent magnets results in a decrease in power output due to a decrease in the magnetic field strength. Power per unit volume (i.e., power density), therefore, can be significantly limited when ordinary permanent magnets are used in motors. Accordingly, there is a need for alternative materials with the potential to produce persistent magnetic fields, such as materials that are less expensive, produce stronger magnetic fields, and/or are lighter.

It has been discovered that a significant magnetic field can be "trapped" by a superconductor when it exhibits large flux pinning forces, which may result in a quasi-permanent magnetic material. In other words, when a superconducting material is placed in a very high magnetic field, the material may be activated to replicate the magnetic field, thereby producing its own persistent magnetic field. In particular, high temperature superconductors (HTSs) can be activated to form trapped field magnets (TFMs), and the resulting magnetic fields have been determined to be stronger than their permanent magnet counterparts when cooled to achievable operating temperatures.

Although research has increased the understanding of HTSs and TFMs, current TFM activation generally has the following limitations: 1) the TFMs can be activated by being placed in a very high magnetic field that is generated, for example, by a very large, expensive, and heavy magnet (e.g., permanent magnet or electromagnet), and then cooled to their operating temperature (this process is called "field-cooled activation"); 2) the TFMs can be cooled and subsequently subjected to a high magnetic field (this process is called "zero-field-cooled activation"); and 3) The zero-field-cooled activation may be done using a pulse of magnetic field (this process is called "pulsed-zero-field-cooled activation"). In the latter two types of activation, the TFMs need to remain very cold during the activation and operation to hold the trapped magnetic field.

Improvements are still needed in creating and manufacturing TFMs. For example, it may be desirable to provide systems and methods for TFM activation that not only provide practical and efficient TFM activation, but also provide robust TFMs that are fully activated. It may also be desirable to provide systems and methods for TFM activation that rely on reduced electrical energy and heating.

SUMMARY

The present disclosure solves one or more of the above-mentioned problems and/or achieves one or more of the above-mentioned desirable features. Other features and/or advantages may become apparent from the description which follows.

In accordance with various exemplary embodiments of the present disclosure, a system for activating trapped field magnets in a superconducting material may include a superconducting material element and an electromagnet source disposed proximate the superconducting material element. The electromagnet source may be configured to produce a magnetic field pulse sufficient to activate the superconducting material element. The superconducting material element may be configured to retain a trapped magnetic field that is substantially equal to a magnetic field generated by the magnetic field pulse.

In accordance with various additional exemplary embodiments of the present disclosure, a method for activating a trapped magnetic field in a superconducting material may include generating at least one magnetic field pulse proximate a superconducting material element. The magnetic field pulse may activate a trapped magnetic field in the superconducting material element that is substantially equal to a magnetic field generated by the magnetic field pulse.

In accordance with various further exemplary embodiments of the present disclosure, a trapped field magnet may include a superconducting material element. The superconducting material element may include a trapped magnetic field generated by a magnetic field pulse configured to activate the superconducting material element. The trapped magnetic field may be substantially equal to a magnetic field generated by the magnetic field pulse. The superconducting material element may further include a plurality of pinning mechanisms configured to raise a current density of the superconducting material element above a threshold current density.

Additional objects and advantages will be set forth in part in the description which follows, and in part will be obvious from the description, or may be learned by practice of the present teachings. At least some of the objects and advantages of the present disclosure may be realized and attained by means of the elements and combinations particularly pointed out in the appended claims.

It is to be understood that both the foregoing general description and the following detailed description are exemplary and explanatory only and are not restrictive of the present disclosure and claims, including equivalents. It should be understood that the present disclosure and claims, in their broadest sense, could be practiced without having one or more features of these exemplary aspects and embodiments.

BRIEF DESCRIPTION OF DRAWINGS

The accompanying drawings, which are incorporated in and constitute a part of this specification, illustrate some exemplary embodiments of the present disclosure and together with the description, serve to explain certain principles. In the drawings.

DESCRIPTION OF EXEMPLARY EMBODIMENTS

Figure 1:
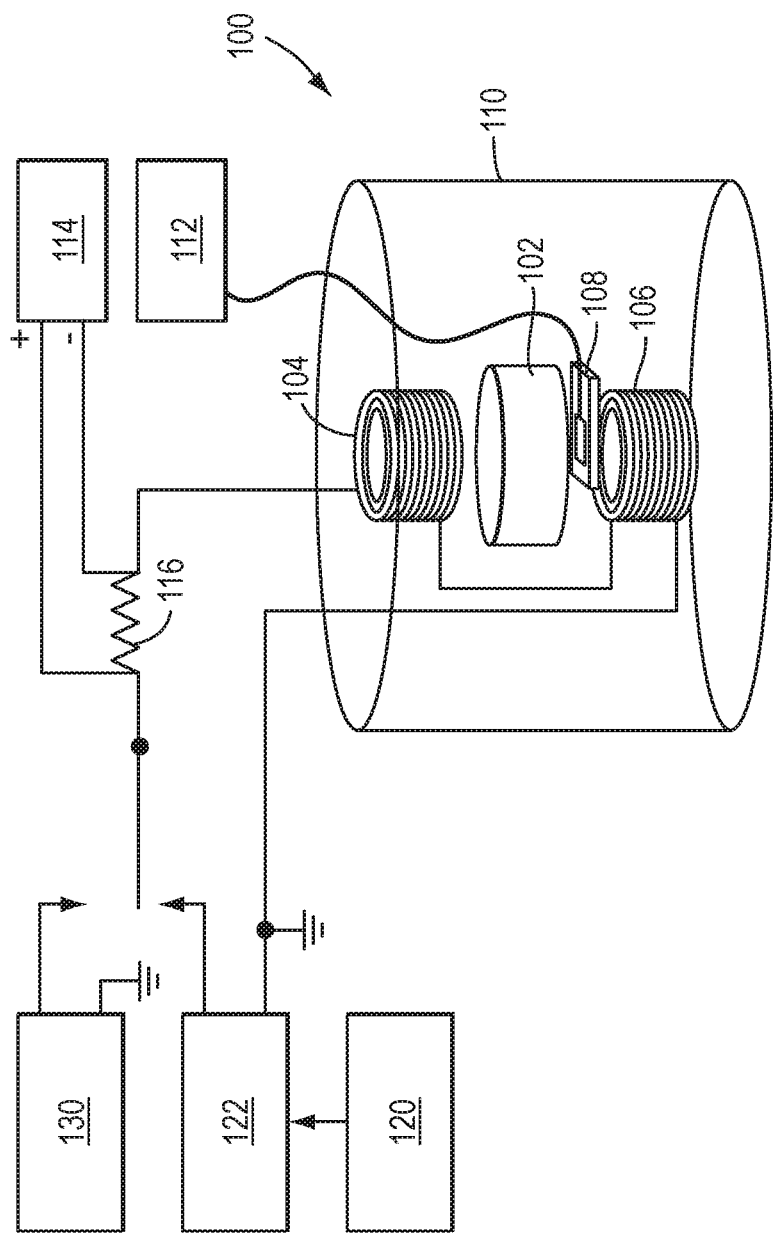
FIG. 1 is a diagrammatic view of an exemplary embodiment of a system for trapped field magnet (TFM) activation in accordance with the present disclosure.

Reference will now be made in detail to various exemplary embodiments of the present disclosure, examples of which are illustrated in the accompanying drawings. Wherever possible, the same reference numbers will be used throughout the drawings to refer to the same or like parts.

Trapped field magnets (TFMs) have great potential to replace conventional permanent magnets in numerous applications, and when operated at substantially low temperatures, exhibit stronger magnetic fields than their permanent magnet counterparts. By way of example, a TFM motor can deliver the same amount of power as a conventional permanent magnet motor but with a significant reduction in size and weight. Although research has increased the understanding of TFMs, a need remains for improved TFM activation techniques, which do not require, for example, exposing superconducting materials (i.e., superconductors) to very large, constant magnetic fields, which are generated, for example, by an expensive, large, and heavy magnet (i.e., permanent magnet or electromagnet). Such conventional activation techniques that use high field electromagnets, are impractical for activating and/or reactivating (e.g., when the TFM loses its magnetic field) a TFM residing within an application in use in a place other than a laboratory. In other words, in various applications it may be desirable to enable activation or reactivation onsite, or in situ, and it may be impractical to do so if reliance is on, for example, a large, heavy permanent magnet or electromagnet.

An alternative to activation using very large constant magnetic fields is pulsed magnetic field activation. Pulsed magnetic field activation can activate a TFM using electromagnets that are much smaller and lighter. However, magnetic field pulses also may generate heat that warms up the TFMs, making them lose all or part of their "trapped" field. Thus, a need remains for improved TFM activation techniques, including pulsed activation techniques, which not only provide practical and efficient activation, but also provide for fully activated TFMs. To accomplish these objectives, systems and methods for TFM activation described herein use very short magnetic field pulses, which require less electrical energy and therefore smaller energy supplies, resulting in less heating of the TFM. Furthermore, the required magnitude of the activating field is significantly reduced, which also reduces the cost and energy usage of the magnet that is used to generate the activating field (thereby also reducing the amount of heat generated by the pulse).

As used herein the terms "trapped field magnet," "TFM," or variations thereof, refer to superconducting materials that have a significant "trapped" magnetic field, resulting in a quasi-permanent magnetic material. In other words, a TFM is a superconducting material that has been activated to replicate a magnetic field to which it has been exposed, thereby producing its own persistent magnetic field. In particular, high temperature superconductors (HTSs), which are materials that become superconductive above the boiling temperature of liquid nitrogen (77 K), can be activated to form TFMs. In various embodiments of the present disclosure, for example, the superconducting material is a bulk HTS material, such as, for example, yttrium barium copper oxides (YBCO). For example, an HTS composed of $YBa_2Cu_3O_{7-\delta}$, becomes superconducting at temperatures below about 93 K. Accordingly, TFMs in accordance with the present disclosure that are made of YBCO can operate at temperatures below about 93 K, down to a temperature of about absolute zero. Furthermore, in general, the magnetic field held by TFMs increases as the temperature decreases.

In various additional exemplary embodiments, the superconducting material is a HTS material, such as, for example, $RE_1Ba_2Cu_3O_{7-\delta}$, where RE is chosen from Y, Nd, La, Sm, Eu, Gd, Dy, Ho, Er, Tm, Yb, Lu, Tb, or mixtures thereof. In various further embodiments, the HTS is composed of $Bi_2Sr_2CaCu_2O_x$; $(Bi,Pb)_2Sr_2CaCu_2O_x$; $Bi_2Sr_2Ca_2Cu_3O_x$; $(Bi,Pb)_2Sr_2Ca_2Cu_3O_x$; $HgBa_2Ca_2Cu_3O_8$; $HgBa_2CaCu_2O_6$; $TlCaBa_2Cu_2O_x$; $Tl_2Ca_2Ba_2Cu_3O_x$; or $Nd_{1+x}Ba_{2-x}Cu_3O_x$. Those of ordinary skill in the art would understand, however, that the present disclosure contemplates systems and methods for activating TFMs in various superconducting materials, including, for example, various HTS materials, based on the application of the TFM, and is not intended to be limited in any manner to the exemplary materials disclosed and claimed herein. Moreover, those of ordinary skill in the art would understand that the size of a TFM depends upon the application. Generally, larger TFMs are more desirable due to their ability to hold a higher magnetic field. TFMs in current applications, for example, range in size from about 1.5 cm to about 10 cm in diameter. It would be understood by those of ordinary skill in the art, however, that Larger TFMs also can be used with appropriate modification to activation technologies.

As used herein, the terms "activate," "activating," "activated," "activation," and variations thereof refer to the occurrence in which a superconducting material is turned from an inert material into a magnet due to exposure to a magnetic field. In other words, a superconducting material may be activated to become a TFM, and a TFM also may be activated by reactivation to maintain and/or recover its magnetic field after having been first activated. A superconducting material is fully activated when it has reached its full magnetization potential from an applied magnetic field and is considered saturated to its maximum trapped field. A superconducting material is said to be partially activated when it is magnetized, but has not yet reached its full magnetization potential. Furthermore, a fully activated TFM gradually loses some of its trapped field by a process known as creep. Typically, creep causes a loss of about 3% to about 7% of the field per decade of time. For example, a TFM having a trapped field of 2 Tesla one day after activation may lose about 0.08 Tesla (4%) by about ten days after activation. Generally creep loss can be held to about 20% loss after one year, with an additional 4% loss after 10 years. TFMs also can lose magnetic field strength and become only partially activated by loss of exposure to cooling sufficient to maintain the magnetic field.

Various exemplary embodiments of the present disclosure contemplate systems and methods for activating trapped field magnets (TFMs) in a superconducting material by exposing a superconducting material element to a magnetic field pulse generated by an electromagnet source, such as, for example, an electromagnet. In various embodiments, for example, the superconducting material element, such as, for example, a high temperature superconducting material (HTS) element, is disposed proximate the electromagnet source and when a current is run through the electromagnet source, the electromagnet source produces a magnetic field pulse that activates the superconducting material element. Various embodiments of the present disclosure contemplate, for example, that contrary to conventional wisdom, the superconducting material element can retain a trapped magnetic field that is substantially equal to a magnetic field generated by the magnetic field pulse produced by the electromagnet source.

Accepted theory as represented by the Bean Model predicts, for example, that: (1) activation of a TFM capable of a maximum trapped field ($B_{T,MAX}$) requires an applied magnetic field ($B_A$) twice the value of $B_{T,MAX}$, or larger, and (2) the magnitude of the trapped field ($B_T$) will increase monotonically with the magnitude of $B_A$ until it reaches $B_{T,MAX}$. (see e.g., C. P. Bean, "Magnetization of High-Field Superconductors," Rev. Mod. Phys. 36, pp. 31-39 (1964)). Various embodiments of the present disclosure contemplate, however, that a superconducting material element may be activated to its $B_{T,MAX}$ by an applied magnetic field pulse ($B_A$) produced by a electromagnet source that is substantially equivalent to $B_{T,MAX}$. In various embodiments, for example, as the magnitude of the applied pulse $B_A$ is increased, a very large, discontinuous field increase also occurs, hereafter referred to as the "giant field leap" (GFL), which for high trapped fields ends close to the fully activated state, $B_{T,MAX}$, of the superconducting material. In this manner, systems and methods of the present disclosure may permit full activation of TFMs with a lower required activation field, thereby requiring less energy, substantially smaller, less expensive, and lighter activation components (e.g., electromagnetic sources), and creating less heat within the TFM than those conventionally used for TFM activation.

Figure 2:
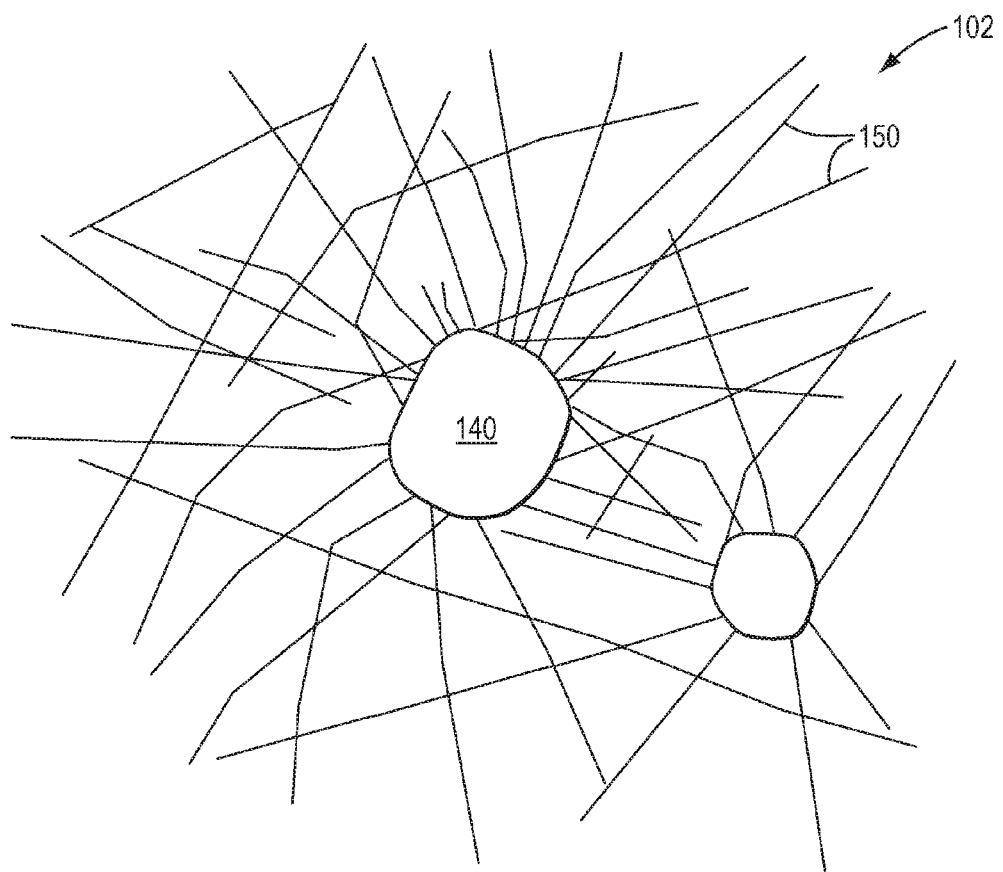
FIG. 2 is an enlarged, partial cross-sectional view of an exemplary embodiment of a HTS used in the system of FIG. 1.

In accordance with various embodiments, the superconducting material element may include pinning centers, or regions of non-superconducting material that function to hold, or "pin," the trapped magnetic field, $B_T$. Such pinning centers may be artificially formed within the superconducting material element by damaging areas of the element to create non-superconducting defects. In various embodiments, for example, high energy ions may be used to create broken columnar defects within the superconducting material (e.g., columns of non-superconducting material). In various exemplary embodiments, as illustrated in FIG. 2, deposits 140 of a uranium bearing compound may be added to the superconducting material element. The element may then be exposed to neutron irradiation, which will cause some of the $U^{235}$ atoms in the deposits to fission and emit high energy ions that create damage tracks 150 as they move through the superconducting material. These damage tracks, or broken columnar defects, act as pinning centers. Superconducting material elements with pinning centers formed by this technique are referenced to herein as U/n-PCs.

In various additional embodiments, dopants of a foreign chemical may be used to create chemical deposits within the superconducting material element, which also act as pinning centers. Superconducting material elements with pinning centers formed by this technique are referenced to herein as Chem-PCs. Those of ordinary skill in the art would understand that the above described pinning centers are exemplary only and that the systems and methods of the present disclosure contemplate using superconducting material elements having various types (i.e. natures), configurations (i.e., geometries), and/or combinations of pinning centers, both natural and artificial, and which are created by various methods and/or techniques.

While not wishing to be bound by a particular theory, the inventors believe that the GFL is a result of the current density $J_C$ and the trapped field $B_T$, which together create a large internal force (the Lorentz force) on the superconducting material element thereby forcing magnetic flux from one region of the element toward another. Thus, the inventors believe, during activation, a superconducting material element will exhibit a GFL (and therefore achieve substantially full activation at $B_{T,MAX} \approx B_A$) when the Lorentz force is high, such as, for example, when there is a high $J_C$, which in turn may produce a high $B_T$. In accordance with this theory, it is believed, for example, that any TFM which exceeds a minimum threshold value of $J_C$ and $B_T$ may exhibit a GFL. In accordance with various embodiments, for example, it is believed that any TFM which exceeds a $J_C$ greater or equal to about 15,000 A/cm$^2$ and a $B_T$ of about 0.5 Tesla may exhibit a GFL, and that as the $J_C$ increases the magnitude of the GFL increases.

Because superconducting material elements having pinning centers, such as, for example, U/n-PCs, Chem-PCs, or a combination of Chem-PCs and U/n-PCs (hereafter referred to as Combo-PCs), which function to increase the $J_C$ and $B_T$ of the superconducting material element above the above threshold level, they may exhibit a GFL during activation. In other words, superconducting material elements having PCs may exhibit a GFL during activation if the product of $J_C$ and $B_{T,MAX}$ is greater than or equal to about 15,000 A/cm$^2$×0.5 Tesla.

FIG. 1 shows a diagrammatic view of an exemplary embodiment of a system 100 for TFM activation in accordance with the present disclosure. The system 100 comprises a superconducting material element 102 that is disposed between two electromagnets 104 and 106. As shown in FIG. 1, in various exemplary embodiments, the superconducting material has a disk shape (e.g., a puck shape) and is positioned between electromagnets 104 and 106, such that electromagnet 104 is above a first end of the superconducting material element 102 and electromagnet 106 is below the opposite end of the superconducting material element 102 in the configuration of FIG. 1. In various exemplary embodiments, the superconducting material element 102 is a high temperature superconducting material as described above, such as, for example, yttrium barium copper oxide. The electromagnets 104, 106 can be wire-wound electromagnets with an iron (or other ferromagnetic) core, comprising a split-field magnet. The electromagnets 104, 106 are wired such that the fields that they produce are in the same direction.

In various exemplary embodiments of the present disclosure, the superconducting disk 102 includes pinning centers, such as, for example, a combination of broken columnar pinning centers 150 (see FIG. 2) of the U/n-PC type and of point pinning centers (not shown) of the Chem-PC type, or Combo-PCs. Accordingly, as described above, during activation, the superconducting disk 102 may exhibit a GFL. In this manner, as described below in more detail for a prototype that was built and tested (see EXAMPLE 1 below), in various exemplary embodiments, a single magnetic field pulse produced by the electromagnets 104, 106 can substantially fully activate the superconducting disk 102 to produce a substantially fully activated TFM at $B_{T,MAX} \approx B_A$. Pulse durations in various exemplary embodiments can range from about 10 ms to about 30 ms, but both shorter and longer pulses also are effective. In various embodiments, a short pulse is desirable because it uses less energy and causes less heating of the TFM and in the associated split magnet coils.

As further shown in FIG. 1, the diameter of the superconducting disk 102 is greater than the diameter of each of the electromagnets 104 and 106, and the electromagnets 104, 106 are positioned substantially centered on the superconducting disk 102. Accordingly, as described in International Patent Application No. PCT/US2013/063710, the entire content of which is incorporated by reference herein, when an electric current is run through the electromagnets 104, 106 (via, e.g., a pulse generator 120 and/or a capacitor 130), the electromagnets 104, 106 will each produce a magnetic field pulse that is large only in an area with smaller physical lateral dimensions than the superconducting disk 102. In other words, substantially all of the magnetic field produced by each of the electromagnets 104, 106 is within a diameter of the superconducting disk 102.

In various exemplary embodiments of the present disclosure, the system 100 may further include a mechanism to maintain the superconducting disk 102 at a sufficiently low temperature to permit the TFM activation. For example, system 100 can include a cryostat 110 filled, for example, with liquid nitrogen at atmospheric pressure. The superconducting material 102 and the electromagnets 104, 106 may be disposed within the filled cryostat 110 to keep the superconducting material 102 at a sufficiently low temperature to inhibit the activated TFM from losing its magnetic field. Lower temperatures of the coolant permit any given TFM to retain higher fields.

Those of ordinary skill in the art would understand that system 100 is exemplary only and intended to illustrate one exemplary embodiment of a system for TFM activation in accordance with the present disclosure. Accordingly, those of ordinary skill in the art would understand that the superconducting disk 102 and electromagnets 104, 106 utilized within the system 100 may have various shapes, dimensions and/or configurations, and be formed from various materials, based, for example, on a particular application and the desired trapped field strength of the TFM. Additionally, although the system 100 utilizes electromagnets 104, 106, systems in accordance with the present disclosure contemplate using any electromagnetic source known to those of ordinary skill in the art to produce the magnetic field pulses. Furthermore, although system 100 includes a cryostat 110 to cool the superconducting material 102, systems in accordance with the present disclosure may utilize any cooling means, device, structure, method, and/or technique known to those of ordinary skill in the art, including, but not limited to, an evaporated cold gas of a low temperature liquid.

Single Pulse Activation

Various design considerations and their impact on the operation of a system for TFM activation, such as that depicted in FIG. 1, are described below for the activation of a superconducting material element with a single magnetic field pulse from electromagnets similar to the system 100 described above.

Example 1

A prototype, having a set up in accordance with the exemplary system 100 diagrammatically depicted in FIG. 1, was built and tested to confirm and study the activation capabilities of the disclosed exemplary system. Each electromagnet 104, 106 was a wire-wound split field electromagnet with a Hiperco® 50 core that was configured with 120 turns of 24-gauge copper magnet wire. The outermost diameter of the electromagnet windings was about 18 mm, and the innermost diameter was about 12 mm (which was set by each core). The superconducting disk 102 was made of a bulk yttrium barium copper oxide (YBCO), had a 20 mm diameter with an axial length of about 8 mm, and contained at least one of the two different types of pinning centers: (1) Chem-PCs, and (2) U/n PCs.

As shown in FIG. 1, in various embodiments, a Hall probe array 108 can be disposed between the superconducting disk 102 and the electromagnet 106 to collect data from the system 100. In the prototype tested in Example 1, the Hall probe array 108 included 7 probes and was disposed in a 1.4 mm gap between the superconducting disk 102 and the electromagnet 106, such that the probe array 108 was sandwiched about 0.7 mm from the surfaces of the superconducting disk and the Hiperco® 50 core of the electromagnet 106. Individual Hall probes (not shown) were spaced about every 1.15 mm to cover the radius of the superconducting disk 102 from 1.7 mm to 8.6 mm of the 10 mm radius of the superconducting disk 102. Data from the Hall probe readouts were logged on a data logger (i.e., a PC) 112, using both an AREPOC™ interface and an interface that was created by the inventors.

Two pulse types were available for activation of the superconducting disk 102. The first type was produced by a pulse generator, labeled 120 in FIG. 1 that drove a fast rise time current supply, labeled 122 in FIG. 1, having a 20 ms rise time, a 100 ms flat top, and a 20 ms fall time. As discussed in International Patent Application No. PCT/US2013/063710, it was found, however, that with this pulse type activation, magnetic field pulses above 40 amps (A) heated the coils of the electromagnets 104, 106. Accordingly, a second type of pulse was used to generate higher magnetic field pulses (e.g., above 40 amps) using a capacitive discharge, from a 0.125 Farad (F) capacitor, labeled 130 in FIG. 1, rated at 100 volts (V). Circuit resistance was 0.236Ω (±8%) and inductance was negligible. Thus, the RC time of the capacitive discharge pulses was about 29.5 ms.

Figure 3:
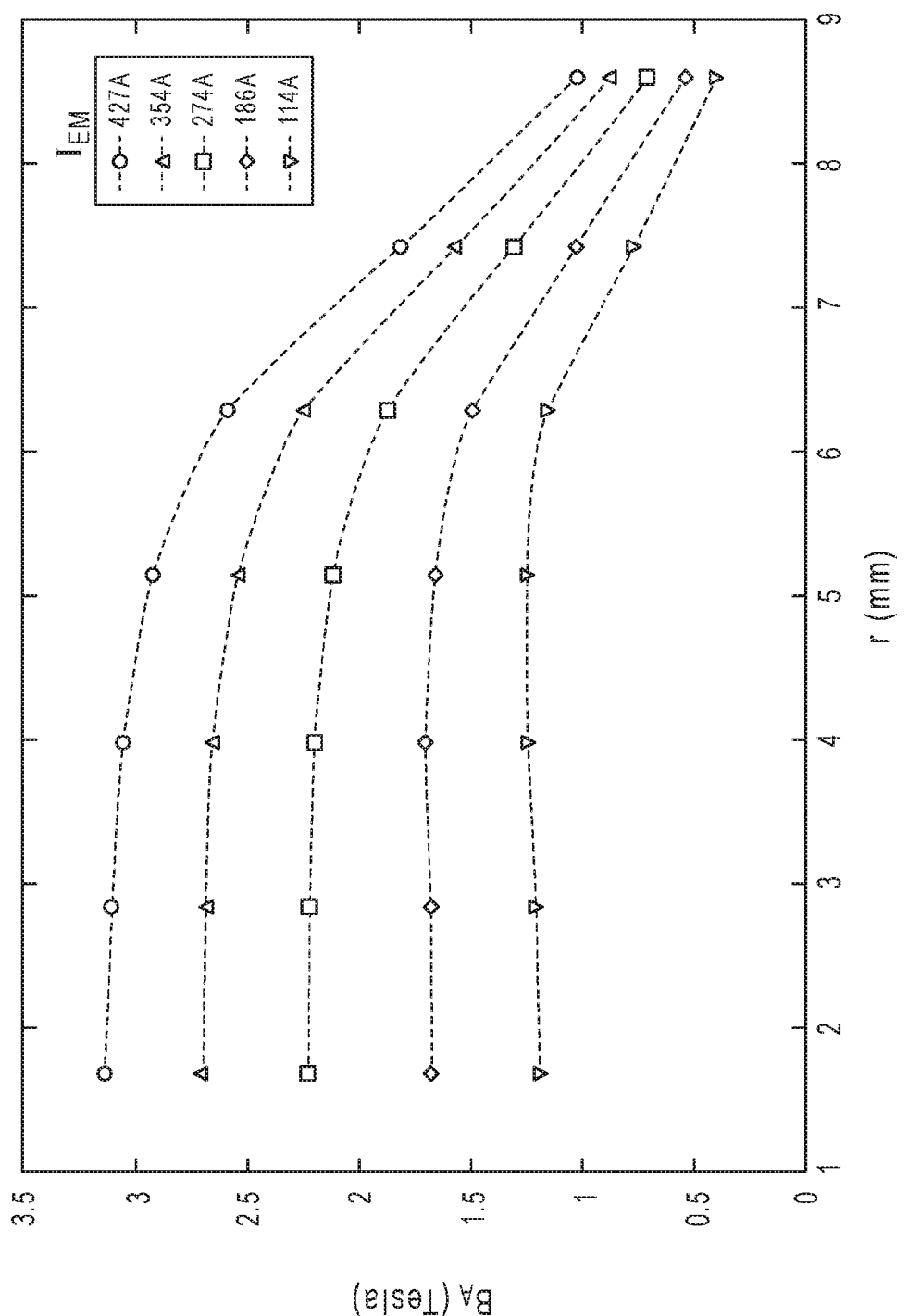
FIG. 3 shows a graph illustrating the applied activating magnetic field $B_A$ as a function of radial position r across an electromagnet (EM) used in the system of FIG. 1, for various electromagnet currents, $I_{EM}$.

An oscilloscope, labeled 114 in FIG. 1, was used to read voltages across a low resistance shunt, labeled 116 in FIG. 1, for calibration studies and current measurement. FIG. 3, for example, shows a measurement of the field produced by the electromagnets 104, 106, or the applied field ($B_A$), when the current ($I_{EM}$) through the electromagnets 104, 106 was varied between 114 A and 427 A.

The first type of superconducting disk 102 tested had point pinning centers (Chem-PCs) made of chemical deposits of $Y_2BaCuO_5$, having diameters typically less than one micron, and which were randomly distributed throughout the HTS sample. These samples contained doping of 0.5 wt % Pt and had a J≈11,300 A/cm². For ease of explanation, a superconducting disk 102 with point pinning centers formed by chemical deposits will hereinafter be referred to as a Chem-PC HTS. The presence of the Hiperco® 50 cores increases the trapped field for a given value of $J_c$. Thus, when activated in the absence of the Hiperco® 50 cores, the Chem-PC HTS had a peak value of trapped field at the center of the TFM, as measured by the field-cool (FC) method of activation, of $B_{T,MAX\ (r=0\ mm)}$≈0.59 Tesla (T). And, when activated in the presence of the Hiperco® 50 cores, the Chem-PC HTC had a $B_{T,MAX\ (r=1.7\ mm)}$≈0.95 T.

The second type of superconducting disk 102 tested had chemical deposits (Chem-PCs), as in the first type, and in addition had broken columnar pinning centers (U/n-PCs). The columns forming the broken columnar pinning centers were each a few microns in length and had a diameter of about 2 ξ≈6.2 nm, where ξ is the HTS coherence length. As explained above, the columns were formed by fission ions, which produced a discontinuous damage trail of amorphous material surrounded by de-oxygenated YBCO. As shown in FIG. 2, for example, the fission ions were emitted isotropically, which resulted in highly splayed quasi-columnar pinning centers (broken columnar pinning centers). As would be understood by those of ordinary skill in the art, such columnar splay resulted in entangled fluxoids, which added stability to the fluxoid array and resulted in a $J_c$ of about 45,000 A/cm² to about 50,000 A/cm². For ease of explanation, a superconducting disk 102 having both point pinning centers formed from chemical deposits and broken columnar pinning centers will hereinafter be referred to as a Combo-PC HTS.

When activated in the absence of the Hiperco® 50 cores, the Combo-PC HTS had a peak value of trapped field at the center of the TFM, as measured by the FC method of activation, of $B_{T,MAX\ (r=0\ mm)}$≈2.207 T. The electromagnet used for the FC activation was, however, not able to provide test fields much higher than this. Accordingly, the trapped field of the Combo-PC HTS, in the presence of the Hiperco® 50 cores, could not be directly measured by FC activation. It was, therefore, estimated indirectly to have a $B_{T,MAX\ (r=1.7\ mm)}$≈3.13 T.

Figure 4:
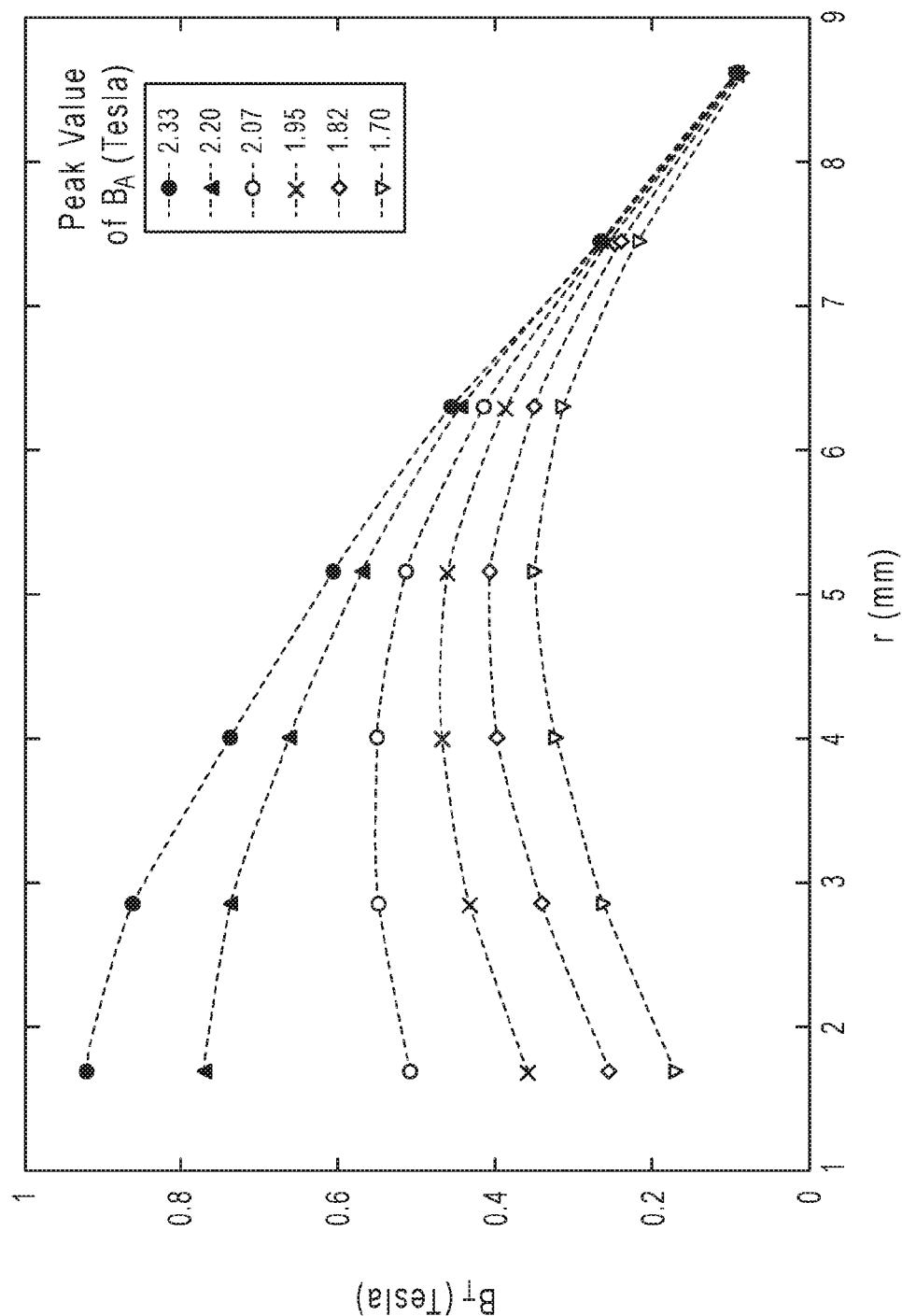
FIG. 4 shows a graph illustrating trapped magnetic field $B_T$ as a function of radial position r across a Chem-PC HTS in the system of FIG. 1, for various applied magnetic fields, $B_A$.
Figure 5:
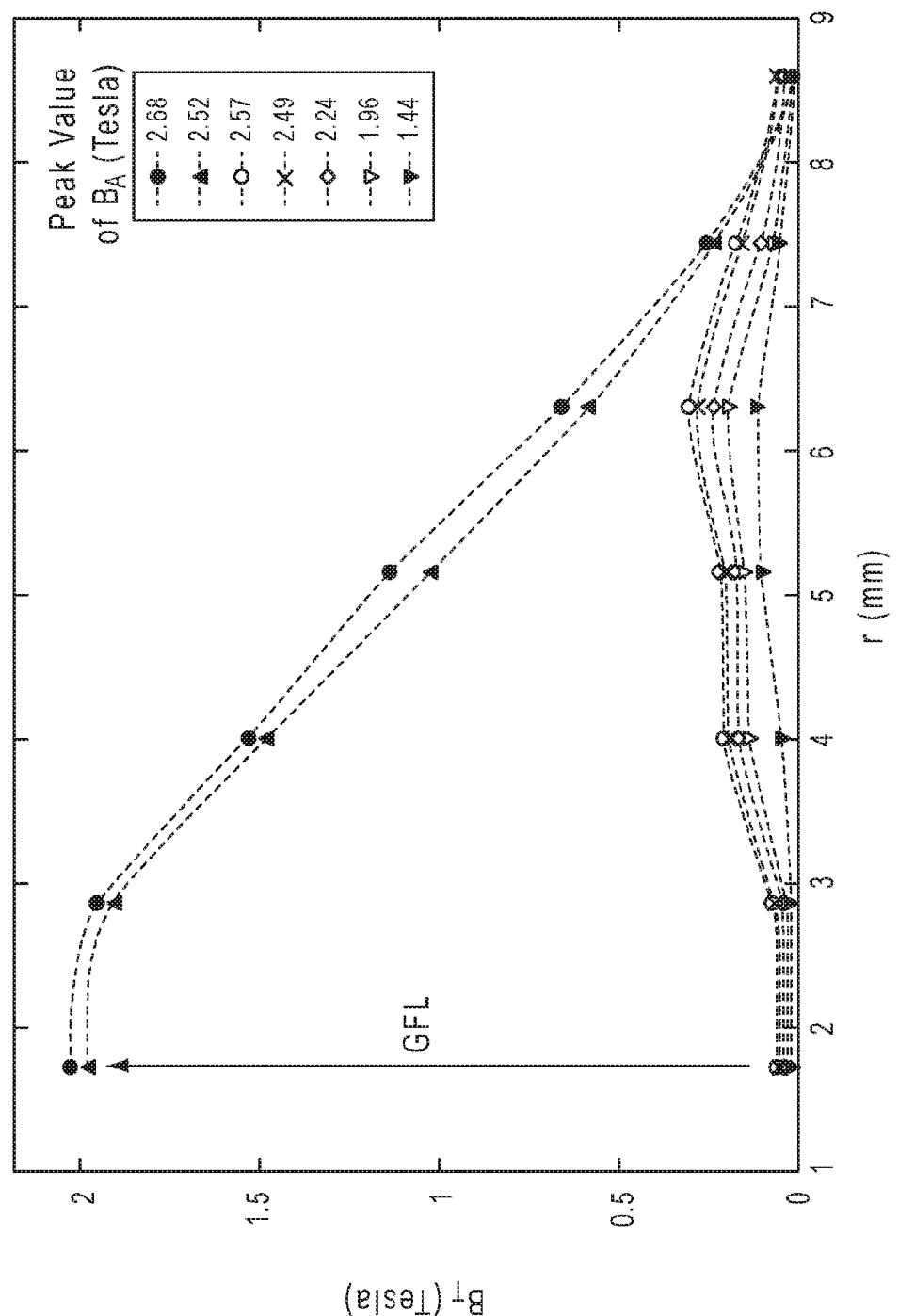
FIG. 5 shows a graph illustrating trapped magnetic field $B_T$ as a function of radial position r across a Combo-PC HTS in the system of FIG. 1, for various applied magnetic fields, $B_A$.

With reference to FIGS. 4 and 5, the residual field of each of the TFMs was studied at a time when the applied magnetic pulse was long over, and flux flow had settled down to the time behavior characteristic of creep. Using the probe array 108, data was collected two minutes after the pulse, on the trapped magnetic field ($B_T$) as a function of radial position r across the superconducting disk 102 (for both a Chem-PC HTS and a Combo-PC HTS), for varying magnitudes of applied field ($B_A$).

FIG. 4 shows results for the trapped magnetic field ($B_T$) as a function of radial position r across a Chem-PC HTS, for an applied magnetic field ($B_A$) ranging from 1.7 T to 2.33 T. As illustrated in FIG. 4, the trapped field increased monotonically with the applied field. In other words, as the pulse magnitude was increased, the resulting trapped field increased without any discontinuities. This increase, as well as the smooth shape of the curve $B_T(r)$, are both consistent with the Bean model, when corrected, for example, for the finite axial length of the cylindrical sample and variations of the applied field with radial position r and axial position z.

FIG. 5 shows results for the trapped magnetic field ($B_T$) as a function of radial position r across a Combo-PC HTS, for an applied magnetic field ($B_A$) ranging from 1.44 T to 2.68 T. As illustrated in FIG. 5, as the pulse magnitude was increased, the resulting trapped field initially increased much like the Chem-PC HTS. However, for an applied magnetic field resulting in a trapped field peak of about 15% of the ultimate peak value, there was a very large discontinuity at low values of r. This observed discontinuity, or giant field leap (GFL), is contrary to the Bean Model which, as above, predicts a smooth progression of the peak in $B_T(r)$ toward r=0 as $B_A$ increases, while the peak value of $B_A$ itself also smoothly increases. Through repeated testing of the Combo-PC HTS, the GFL was found to always occur at the same applied field (i.e., at the same coil current $I_{EM}$), without causing any damage to the YBCO bulk. Furthermore, essentially identical results were seen in five similar YBCO samples.

In a further comparison to the Bean model, the peak value of the trapped field near the center (r=1.7 mm) of the Combo-PC HTS was compared to the pulsed applied field $B_A$ which caused it. As illustrated in FIG. 5, the value of $B_{T,MAX}$ measured at the Hall probes 108 was approximately 2.10 T. Accordingly, it was determined, after correction to a surface value, that the maximum trapped field at the Hall probe closest to the center (r=1.7 mm) of the Combo-PC HTS was about 2.73 T. As above, the Bean Model predicts that activation of a TFM capable of a $B_{T,MAX}$ requires an applied magnetic field ($B_A$) twice the value of $B_{T,MAX}$. Accordingly, the Bean model prediction of the minimum applied field required to achieve this activation was 5.46 T (i.e., 2×2.73 T). However, contrary to this prediction, the activation field $B_A$ as measured at the Hall probes 108 was about 2.68, which after correction to a surface value was about 2.50 T. The ratio of $B_A$ to $B_{T,MAX}$ for the Combo-PC HTS was, therefore, determined to be about 0.92%, which, within experimental error, is consistent with a 1:1 ratio, rather than the 2:1 ratio predicted by the Bean Model.

As above, in the presence of the Hiperco® 50 cores, the expected surface value of $B_{T,MAX}$ (r=1.7 mm) for the Combo-PC HTS was about 3.13 Tesla at 77 K as measured by the FC method of activation. The surface value achieved during prototype testing, however, was about 2.73 T, which was only about 87% of the expected value. It was determined, however, that a temperature increase of about 3 K occurred, which contributed to the 13% decrease in trapped field.

The ratio of $B_A$ to $B_{T,MAX}$ for the Chem-PC HTS, which did not exhibit the GFL, was determined to be about 1.86, which, within experimental error, is consistent with the ≥2:1 ratio predicted by the Bean Model.

Additional behavioral anomalies with respect to the Bean Model also were found in the order in which the applied field penetrated the Combo-PC HTS. The Bean Model predicts that current density in various portions of the bulk is either zero or $J_c$. Accordingly, if the HTS is zero-field-cooled (ZFC) activated, as the applied field $B_A$ increases, the field penetration and the portions of the bulk carrying $J_c$ start first at a large radius, r, and progress toward a small radius, r. As this penetration occurs, the peak value of $B_T$ progresses from large r toward r=0, and increases as it progresses. As shown in FIG. 4, this behavior was observed for the Chem-PC HTS over the full range of activation. For the Combo-PC HTS, however, it was observed that, after the GFL, a low point in trapped field, or a flux deficit, existed in the region from r=4 mm to r=6 mm, which deficit would fill in after multiple applied pulses. Since the Bean Model requires r~5 mm to be fully activated before lower values of r can be fully activated, this flux deficit at the middle values of r was determined to be another anomaly exhibited by the Combo-PC HTS.

Figure 6:
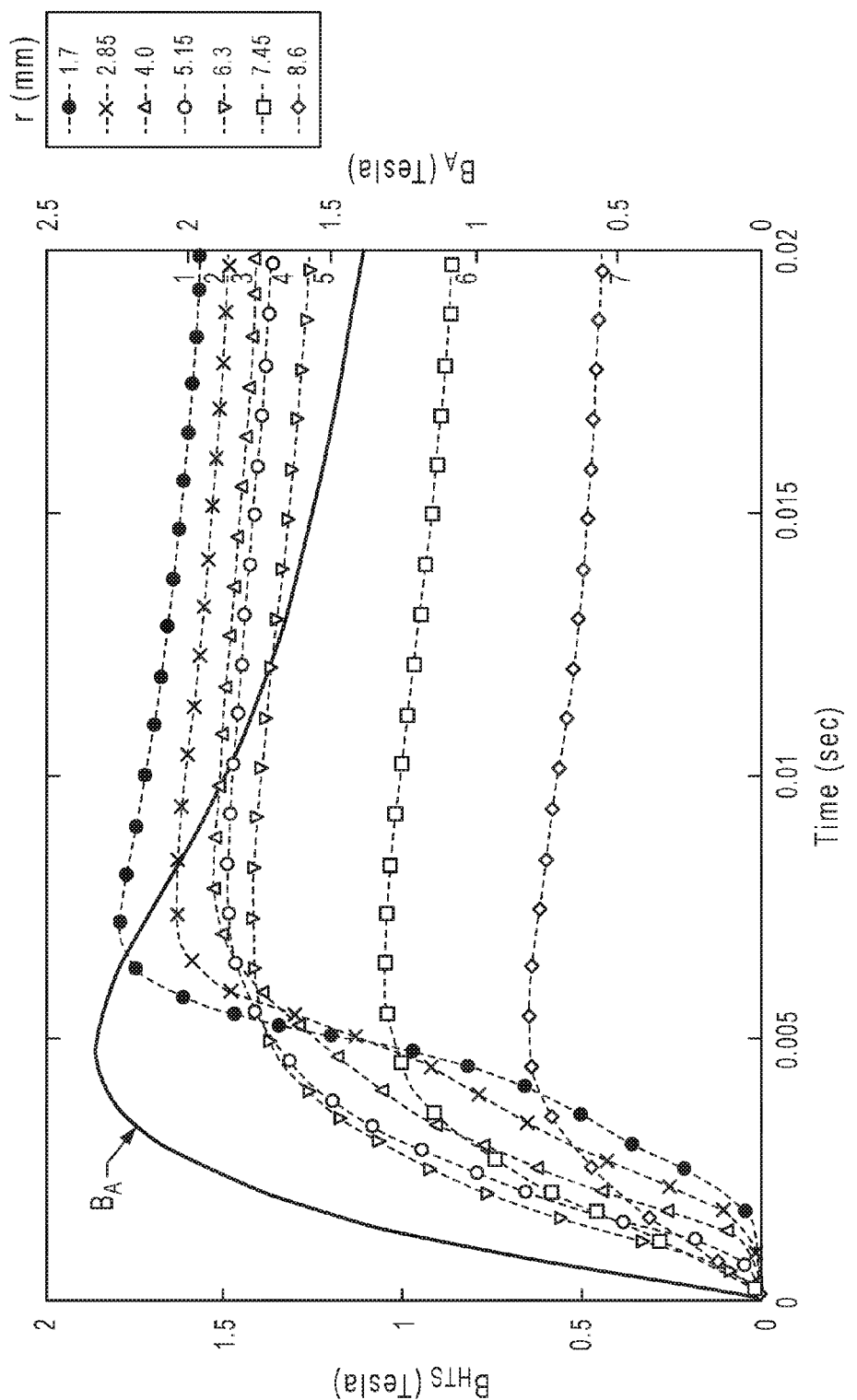
FIG. 6 shows a graph illustrating the magnetic field $B_{HTS}$ as a function of time, at various radial positions r across the Chem-PC HTS in the system of FIG. 1, and the corresponding applied activating magnetic field $B_A$ as a function of time.
Figure 7:
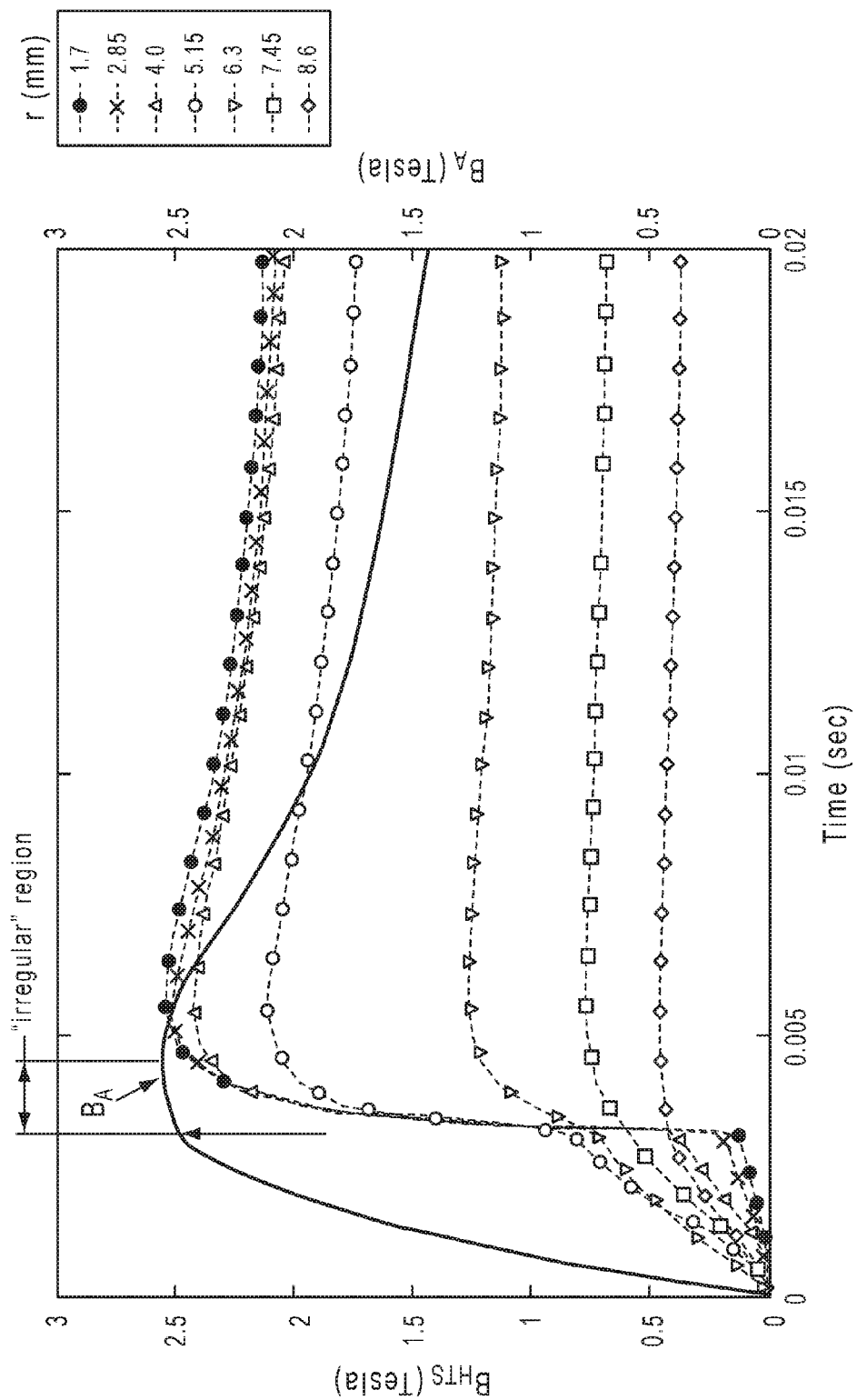
FIG. 7 shows a graph illustrating the magnetic field $B_{HTS}$ as a function of time, at various radial positions r across the Combo-PC HTS in the system of FIG. 1, and the corresponding applied activating magnetic field $B_A$ as a function of time.

The presence of such anomalies was further studied during the applied pulsed field to determine the rate of flux penetration during the GFL. With reference to FIGS. 6 and 7, using the probe array 108, data was collected, for example, on the magnetic field in the HTS, $B_{HTS}$, as a function of time, at various radial positions r across the superconducting disk 102 (for both a Chem-PC HTS and a Combo-PC HTS). Data also was collected on the corresponding applied magnetic field as a function of time, $B_A$ (time). Measurements of the applied field, shown in FIG. 3, were done with the YBCO bulk removed in order to distinguish $B_A$ from the shielding effects of the YBCO. In FIGS. 6 and 7, using data as in FIG. 3, $B_A$ (time) was included from applied currents ($I_{EM}$) measured with the YBCO in place in order to determine the time at which a sudden field change "marker" may occur.

FIG. 6 is included for comparison purposes and shows a time study for the Chem-PC HTS; and FIG. 7 shows a time study for the Combo-PC HTS (in which the GFL was observed). The solid line in each of FIGS. 6 and 7 shows the applied magnetic field, $B_A$, as a function of time, while the other lines in each figure show $B_{HTS}$ as a function of time at each of the seven different Hall probe positions. As illustrated in FIG. 7, after about 3 ms, a rapid, very large decrease occurred in the shielding field, and the applied field rapidly penetrated the HTS at values of r=1.7 mm and 2.85 mm, and less so at 4.0 mm. The time required for this penetration was about 1 to 2 ms. At the same time the field at r=5.15 mm showed a smaller flux leap (and in some samples a flux decrease).

As also illustrated in FIG. 7, it was further observed that the rapid field change in the HTS also affected the applied current ($I_{EM}$), from which the $B_A$ illustrated in FIG. 7 was calculated, causing a small irregularity in the applied field just prior to the peak of the pulse. The approximate value of $dB_A/dt$ in this region (just prior to the peak of the pulse) was used to estimate the induced electric field in the region 1.7<r<2.85 mm, and it was determined that this field greatly exceeded the value of ~1 µV/cm, at which the HTS is driven into a resistive state. Thus, it was determined that the GFL occurs in a very short period of time as the HTS is exiting from the resistive state.

Figure 8:
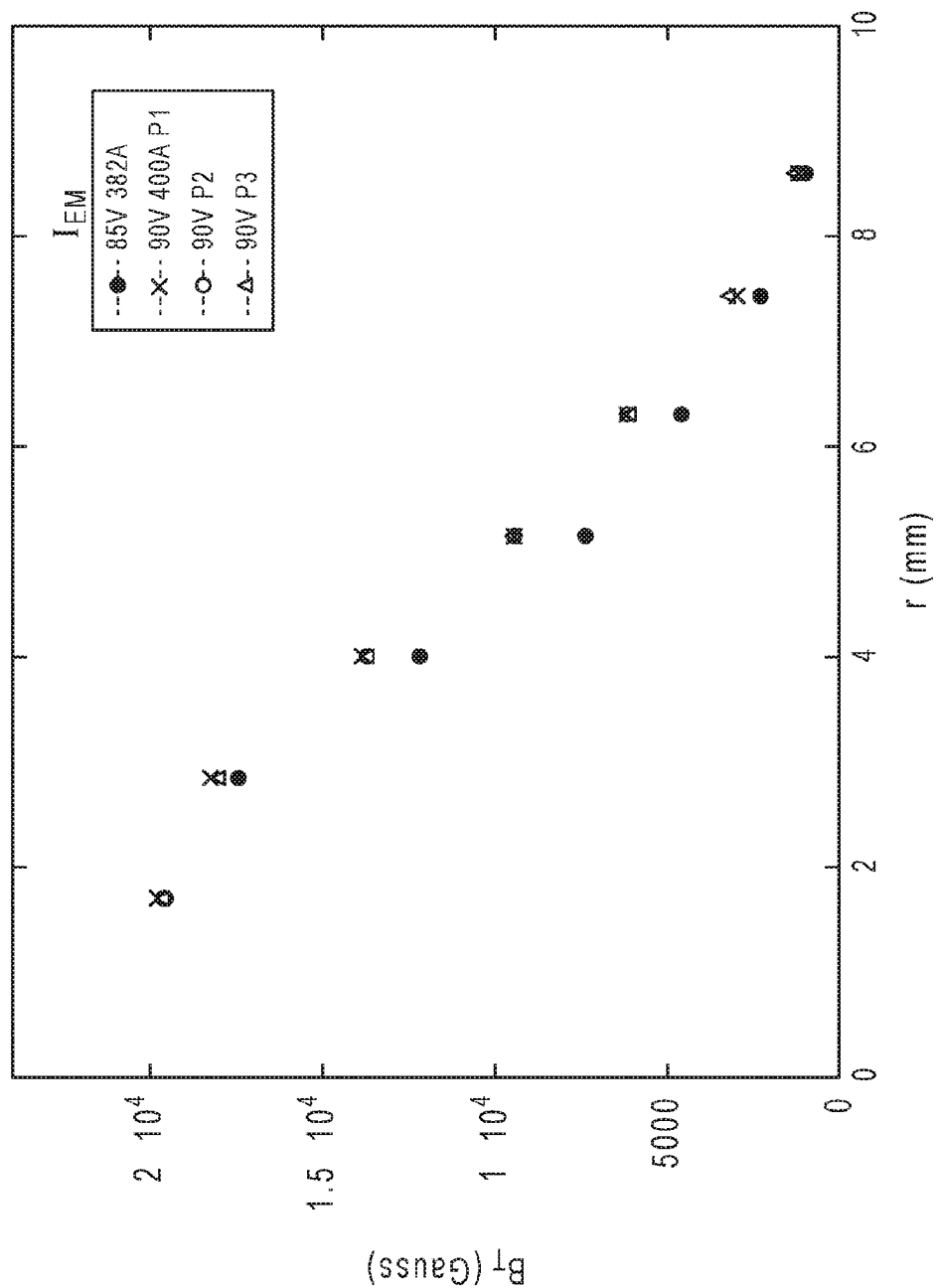
FIG. 8 shows a graph illustrating trapped magnetic field $B_T$ as a function of radial position r across a Combo-PC HTS in the system of FIG. 1, for various electromagnet currents $I_{EM}$.

As above, while not wishing to be bound by a particular theory, it is believed that the GFL is caused by a combination of $J_c$ and $B_T$ (the Lorentz force), which creates a large internal force on the HTS that forces magnetic flux from one region of the HTS toward another. As illustrated in FIG. 8, which shows results for the trapped magnetic field $B_T$ as a function of radial position r across the Combo-PC HTS, the $B_T$ in the mid-r region (from about r=4 mm to about r=6 mm) is low, just after the GFL. In accordance with the above theory, it is believed that the small deficit in flux in the region r=4 mm to r=6 mm occurs at a point at which, prior to GFL, the Bean Model predicted a maximum trapped field, and a reversal of $J_c$. The reversal of $J_c$ reversed the direction of the Lorentz force ($F_L$). However, with the Combo-PC HTS, the large $F_L$ appeared to force magnetic flux from the mid-r region to the low-r region and thereby created the flux deficit. Accordingly, it is believed that the large $F_L$ of the Combo-PC HTS may be a factor in producing the GFL. When the applied field exceeds the threshold of the GFL, the flux deficit will fill in, as seen in FIG. 8.

Example 2

Due to the discrepancy between the Combo-PC HTS and the Chem-PC HTS samples described above, further experiments were conducted, using the same prototype used in EXAMPLE 1, to better determine the effects of the pinning center (PC) geometry (i.e., type and number of PCs) used to obtain the $J_c$ of the superconducting material element. The results and conclusions of these experiments are described below.

Figure 9:
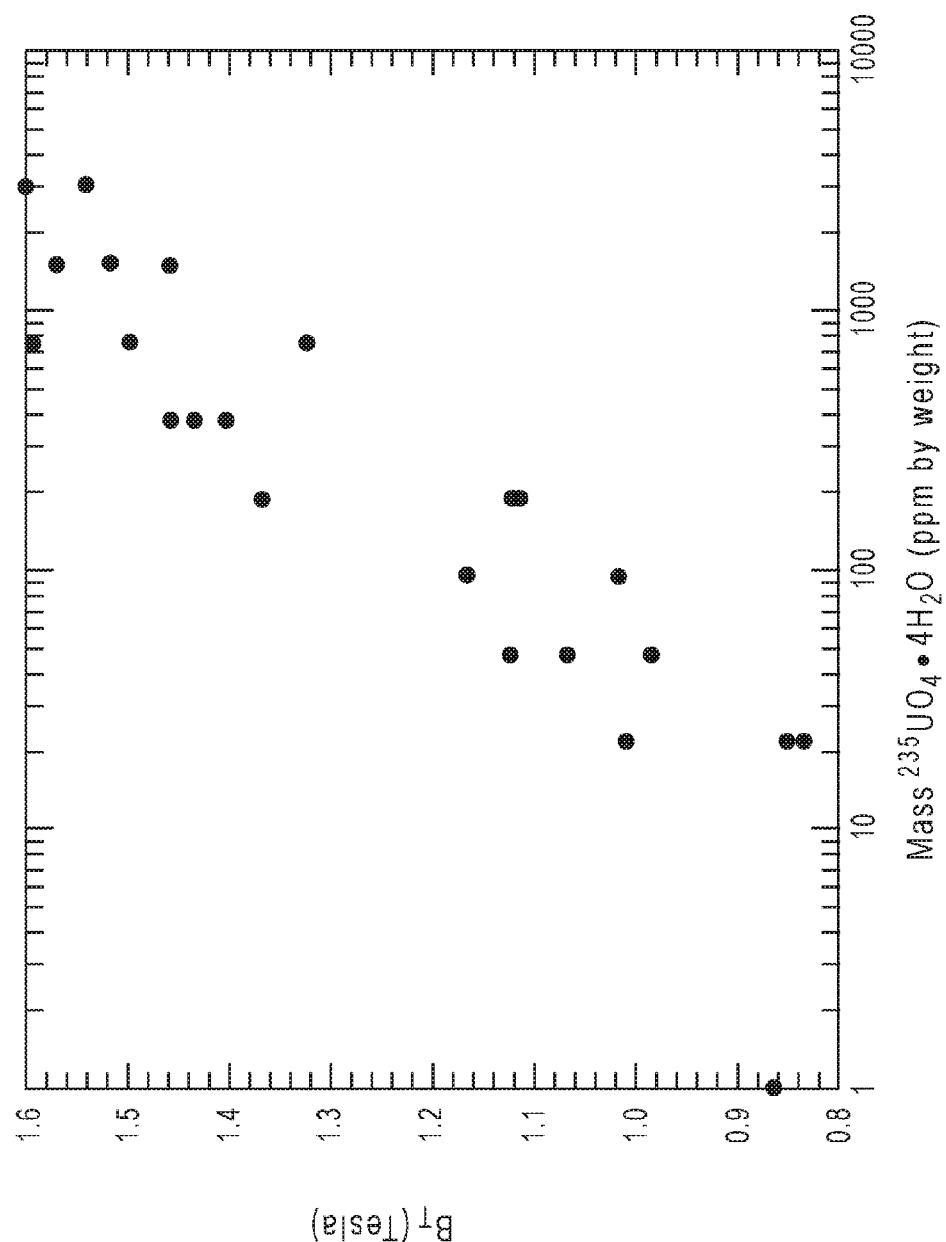
FIG. 9 shows a graph illustrating trapped magnetic field $B_T$ as a function of $U^{235}$ content for a Combo-PC HTS, following neutron irradiation.

To better understand the effects of the number of PCs used in a superconducting material element on the GFL, twenty-five superconducting disks 102 were produced with varying $U^{235}$ content. The $U^{235}$ content of the samples used to produce the disks 102 varied from about 0 to about 0.3% by weight of each sample. The samples were then irradiated with thermal neutrons, which produced a varying number of uranium fissions based on the $U^{235}$ content of the sample, each of which created a broken-columnar damage track in the respective sample. The superconducting disks 102 produced, therefore, had a large variation in the number of PCs, and therefore in $J_C$ and $B_T$. FIG. 9 shows a graph illustrating the trapped magnetic field $B_T$ as a function of the $U^{235}$ content for the samples.

Each superconducting disk 102 was tested to see whether or not the GFL occurred, and if the GFL occurred, to learn the various variables under which the GFL occurs, including, for example, the threshold trapped field, $B_{Threshold}$, and the maximum trapped field at the end of the GFL, $B_{End}$. As above, all measurements were done in liquid nitrogen, with a temperature of about 77 K, and at atmospheric pressure.

Figure 10:
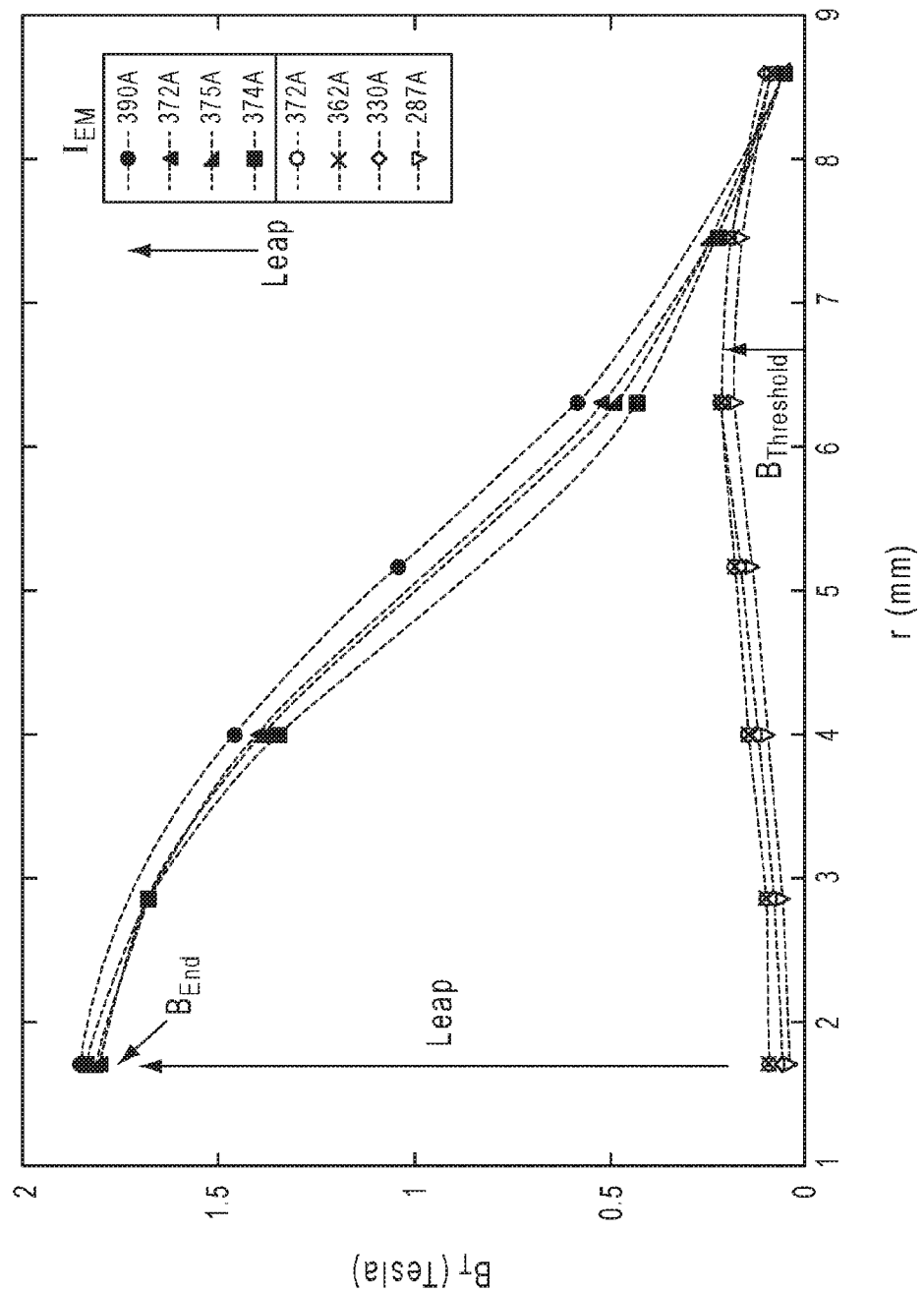
FIG. 10 shows a graph illustrating the trapped magnetic field $B_T$ as a function of radial position r across a HTS with a high $U^{235}$ content in the system of FIG. 1, for various electromagnet currents, $I_{EM}$.
Figure 11:
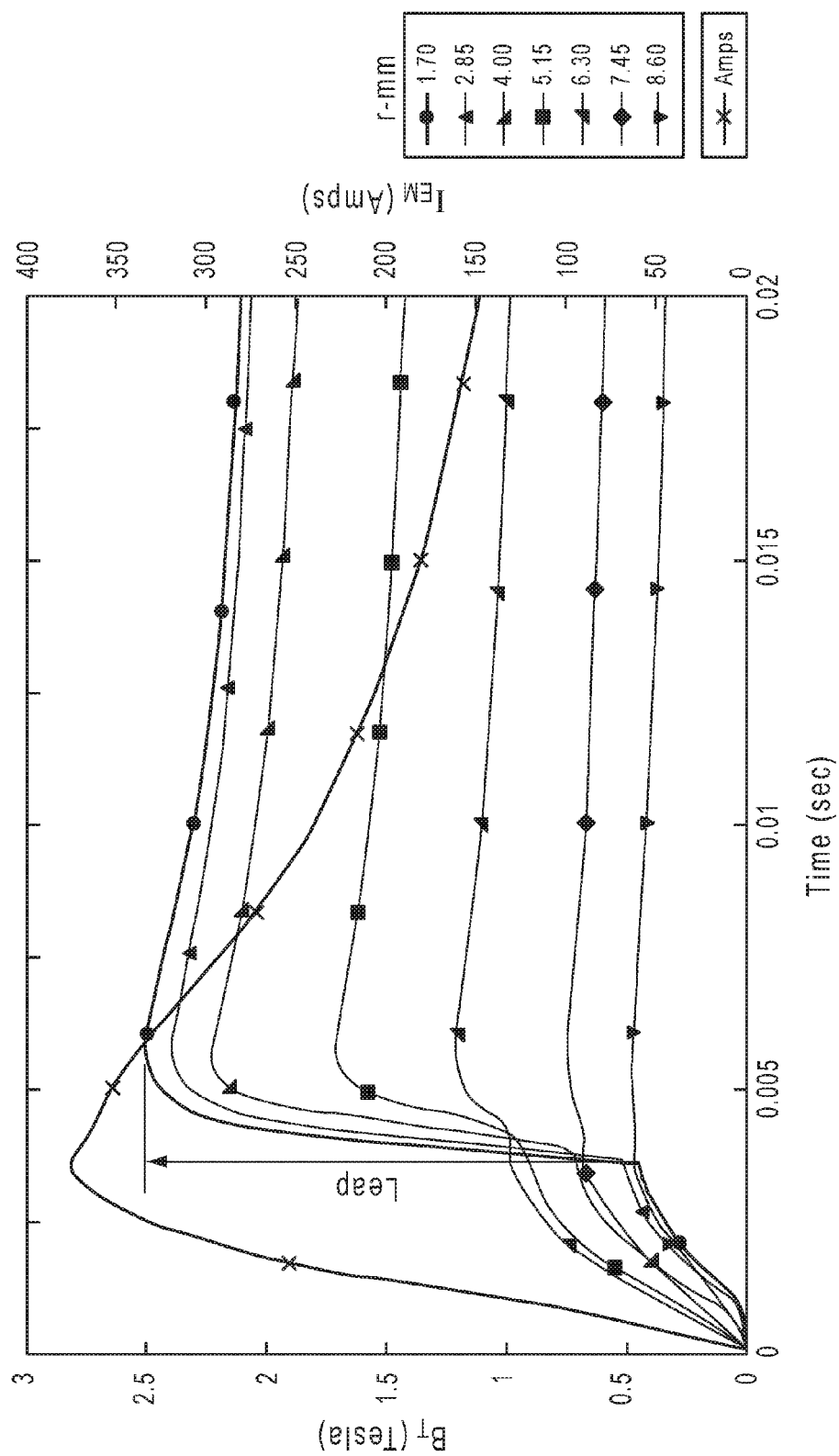
FIG. 11 shows a graph illustrating the trapped magnetic field $B_T$ as a function of time, at various radial positions r across the HTS of FIG. 10, and the corresponding applied electromagnet current $I_{EM}$ as a function of time.

FIG. 10 shows the resultant trapped field $B_T$ two minutes after an actuation pulse, for a disk 102 with a high $U^{235}$ content in the system of FIG. 1, and which exhibited a $B_{T,MAX}$ of about 1.8 Tesla (which was the highest $B_T$ achieved in this experiment). FIG. 10 shows $B_T$ as a function of radial position r across the disk 102, for an electromagnet current $I_{EM}$ varying from 287 amps to 390 amps. As above, two variables of the disk 102 were particularly noted and are indicated on FIG. 10: (1) $B_{Threshold}$, which is the highest field achieved just prior to the GFL, and (2) $B_{End}$, which is the highest field achieved just after the GFL. FIG. 11 shows data for the same disk 102 on a time scale.

Figure 12:
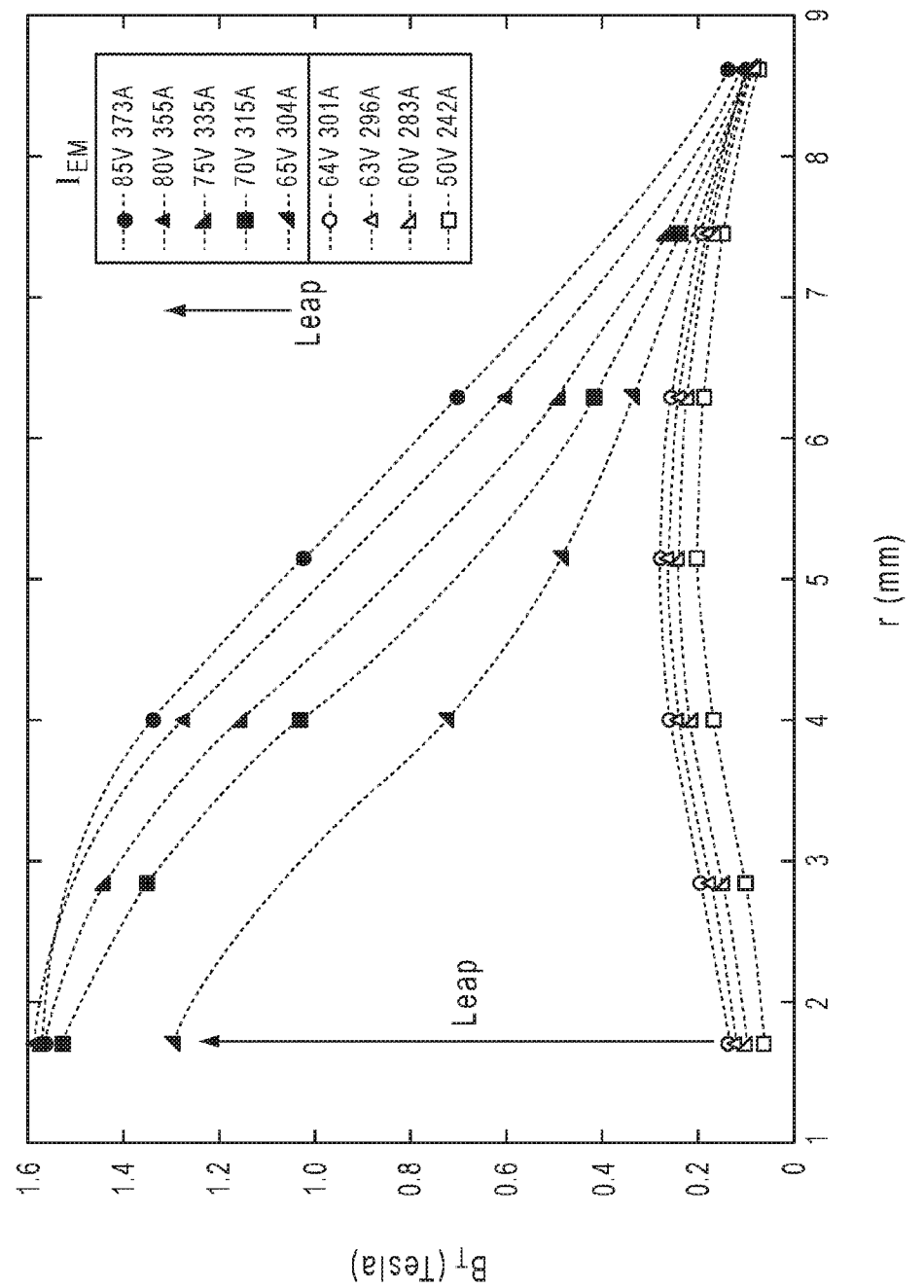
FIG. 12 shows a graph illustrating the trapped magnetic field $B_T$ as a function of radial position r across a HTS with a medium $U^{235}$ content in the system of FIG. 1, for various electromagnet currents.
Figure 13:
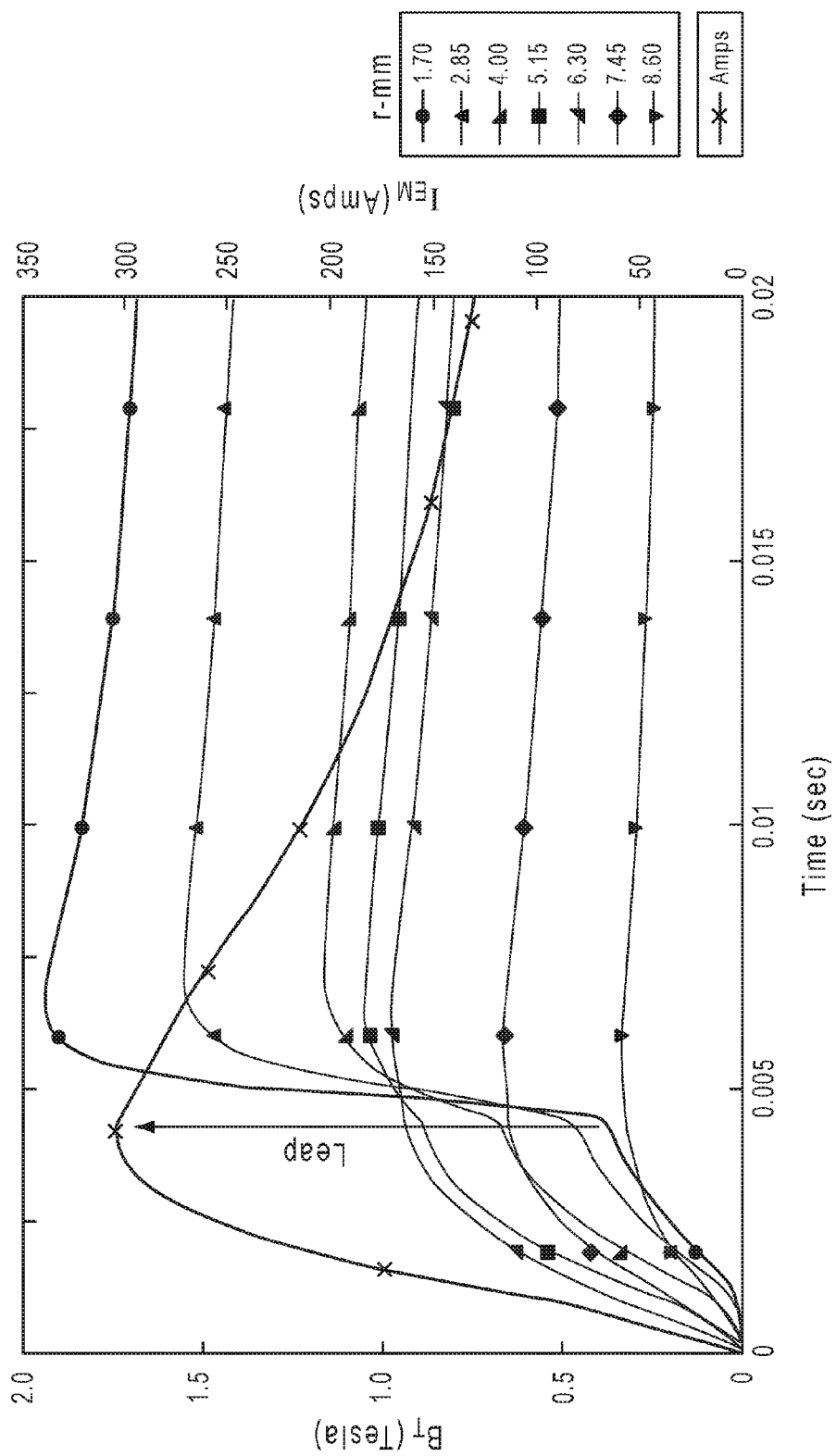
FIG. 13 shows a graph illustrating the trapped magnetic field $B_T$ as a function of time, at various radial positions r across the HTS of FIG. 12, and the corresponding applied electromagnet current $I_{EM}$ as a function of time.
Figure 14:
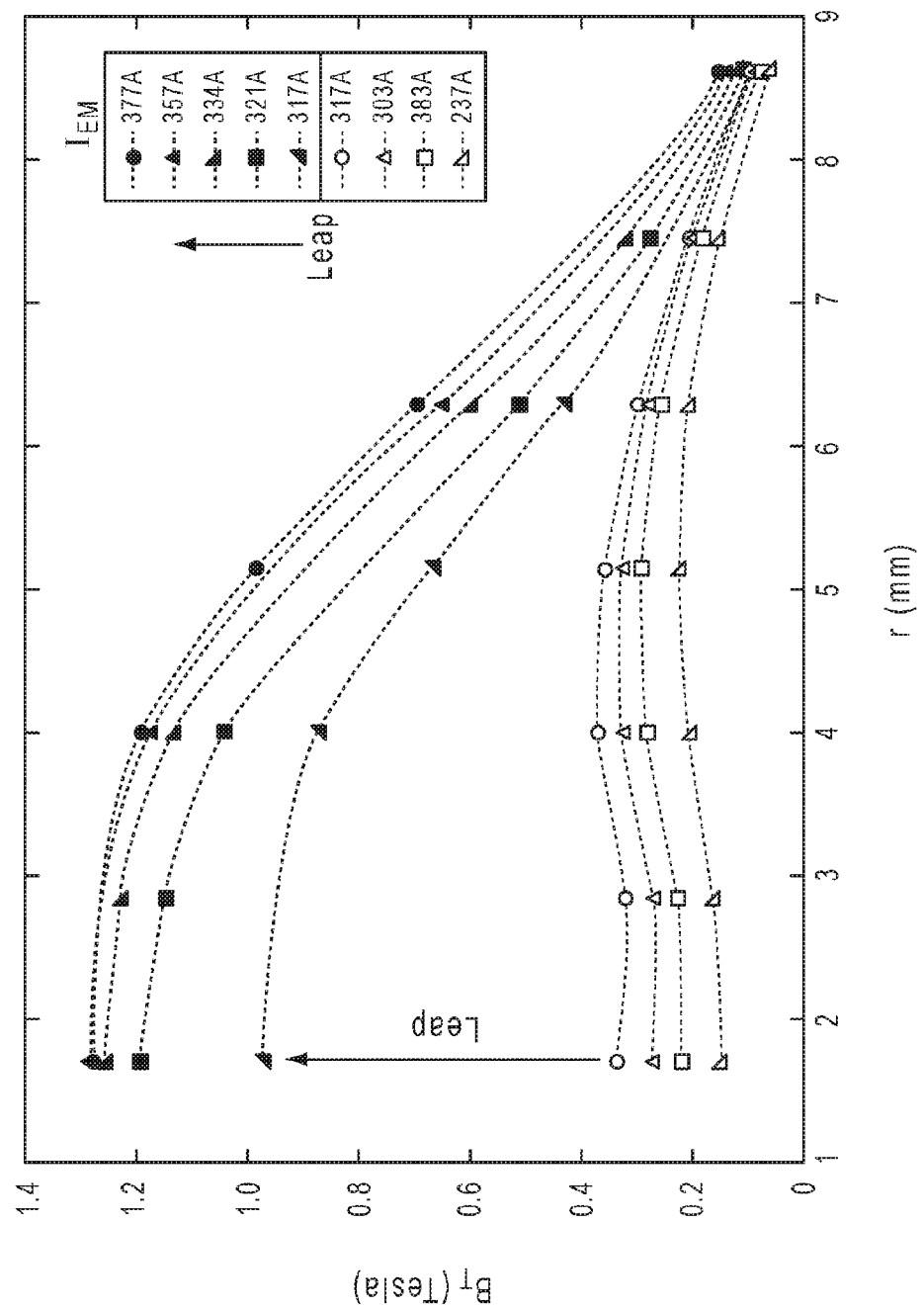
FIG. 14 shows a graph illustrating the trapped magnetic field $B_T$ as a function of radial position r across a HTS with a low $U^{235}$ content in the system of FIG. 1, for various electromagnet currents.
Figure 15:
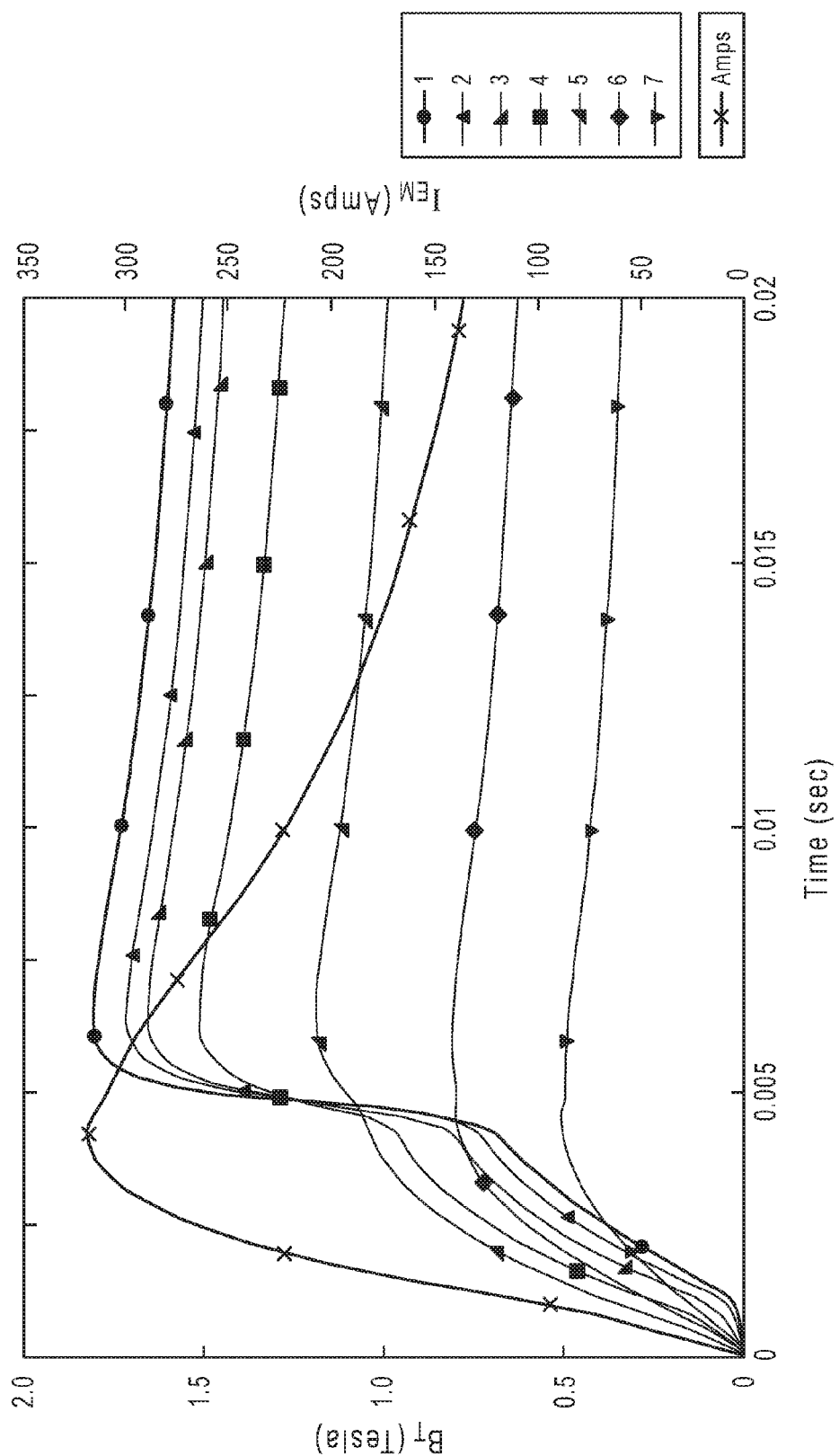
FIG. 15 shows a graph illustrating the trapped magnetic field $B_T$ as a function of time, at various radial positions r across the HTS of FIG. 14, and the corresponding applied electromagnet current $I_{EM}$ as a function of time.

In a similar manner, FIGS. 12 and 13 show the resultant trapped field $B_T$ for a disk 102 with a medium $U^{235}$ content in the system of FIG. 1 (which exhibited a $B_{T,MAX}$ of about 1.6 Tesla), and FIGS. 14 and 15 show the resultant trapped field $B_T$ for a disk 102 with a low $U^{235}$ content in the system of FIG. 1 (which exhibited a $B_{T,MAX}$ of about 1.3 Tesla). Similar to FIG. 10, FIGS. 12 and 14 show $B_T$ as a function of radial position r across each respective disk 102, for various electromagnet currents $I_{EM}$, and similar to FIG. 11, FIGS. 13 and 15 show data for the same respective disks 102 on a time scale.

Figure 16:
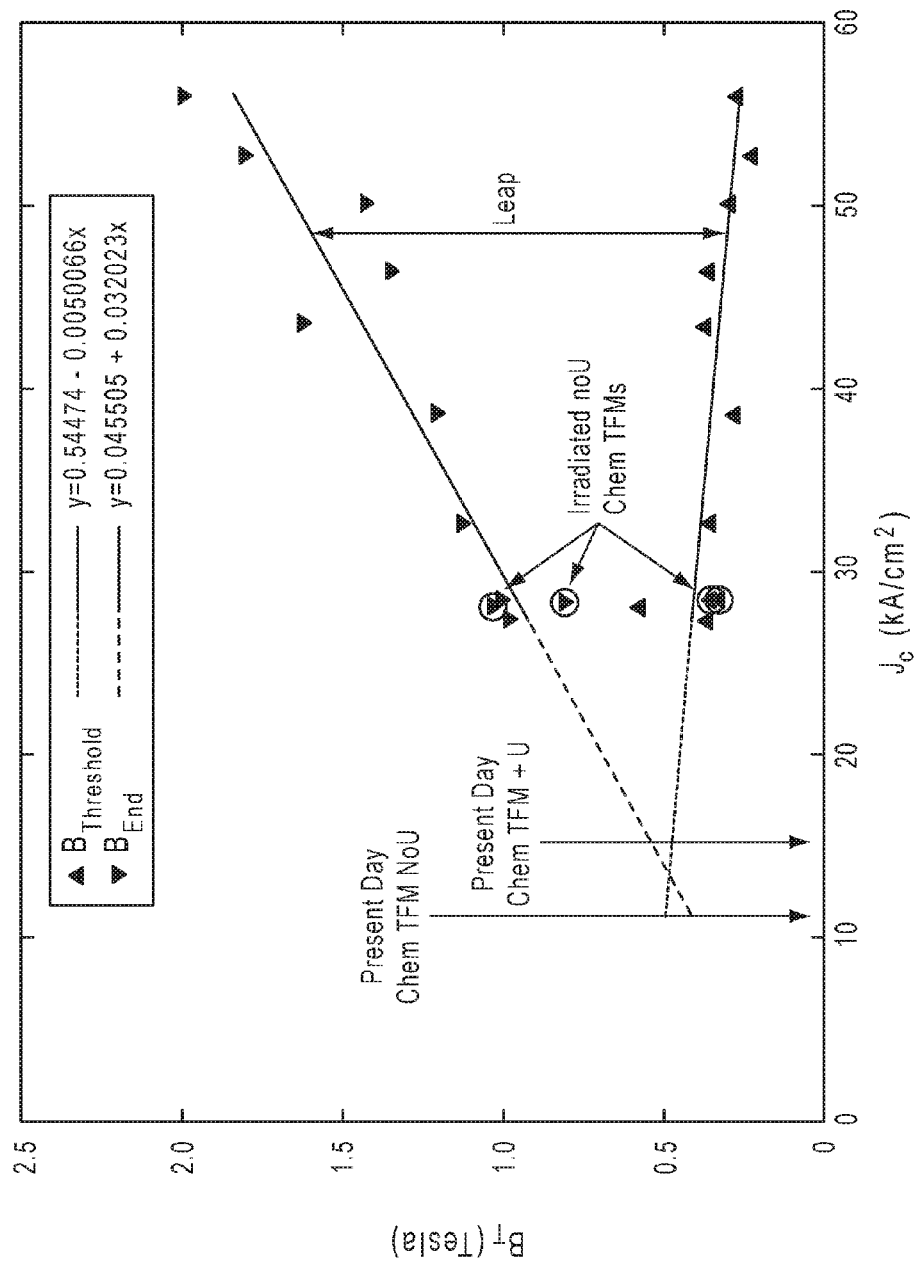
FIG. 16 shows graphs illustrating the trapped magnetic field $B_T$ at the onset of GFL and the completion of GFL, as a function of applied current density $J_C$ for various HTSs.

As illustrated in FIG. 16, to better understand the variables under which the GFL occurs, the resultant $B_{Threshold}$ and $B_{End}$ for each disk 102 were then plotted as a function of $J_C$. The individual experimental points for $B_{Threshold}$ are each shown as triangles that are pointed upward, and the individual experimental points for $B_{End}$ are each shown as triangles that are pointed downward. As shown in FIG. 16, the resultant plots for $B_{Threshold}$ and $B_{End}$ each form a slowly varying function of $J_C$, wherein the difference between the plots represents the magnitude of the GFL. In other words, the gap between the two lines of FIG. 16 represents the magnitude of the GFL (or the change in the trapped field $\Delta B_T$ due to the GFL), which as projected increases as $J_c$ increases. Furthermore, based on the plotted data, a rough approximation of the magnitude of the GFL was found to be:

$$\text{Magnitude of GFL} \equiv \Delta B \approx 2 \text{ Tesla}(J_C - 15{,}000 \text{ Acm}^{-2})/35{,}000 \text{ Acm}^{-2} \quad [1]$$

Based on this data and the extrapolated functional relationships shown by the two lines in FIG. 16, the inventors discovered that the GFL is not restricted to TFMs of very high currents, having, for example, a high $U^{235}$ content (such as, e.g., Combo-PC HTSs), but instead applies to any TFM with a current density $J_C$ greater than or equal to about 15,000 A/cm². As shown, however, in the extrapolated portion of FIG. 16, the GFL is very small for low current densities (e.g., a $J_C$ of slightly less than about 15,000 A/cm²), and is therefore difficult to observe when the $J_C$ is very close to the onset of the GFL. In other words, the GFL exhibited by a superconducting material element having a $J_C$ at or close to about 15,000 A/cm² would only cause a very slight distortion of the Bean Model predictions.

This finding was further confirmed by the experimental data from the irradiated samples having no $U^{235}$ content (non-U Samples). Because these samples had no $U^{235}$ content, during the irradiation process, when the neutrons struck the atoms of these samples, arrays of columnar PCs were not formed. However, several other nuclear interactions that release less energy did occur, such as, for example, $Y^{88}$+ n→$Y^{89}$+γ. The small recoil energy of $Y^{89}$ left a pinning center (PC) of small dimensions (e.g., typically a few nm). Superconducting material elements with pinning centers formed by this technique are referenced to herein as $Y^{89}$-PCs. As demonstrated by the experiments, although $Y^{89}$-PCs are less effective than the broken columnar PCs caused by fission fragments (i.e., U/n-PCs), they nevertheless also increase the $J_C$ of a superconducting material element. The $Y^{89}$-PCs in the irradiated non-U samples, for example, increased the $J_C$ of the samples from about 11,300 A/cm², which is characteristic of the unirradiated Chem-PC HTSs used above in EXAMPLE 1, to about 22,600 A/cm².

Thus, based on the above findings, the $J_C$ of the irradiated non-U samples lies within the region in which a GFL is expected, with an expected GFL magnitude of about 0.7 T (see FIG. 16). When the irradiated non-U disks 102 were tested they also exhibited the GFL, with an observed magnitude of about 0.73 T, a difference from the predicted magnitude that is well within experimental error. Thus, in accordance with the above findings, the irradiated non-U TFMs undergo a GFL when their characteristic $J_C$ is above about 15,000 A/cm², as do the irradiated U TFMs. In addition, the magnitude of their GFL is substantially the same as for the irradiated U TFMs. It was, therefore, concluded that the conditions required for GFL depend on $J_C$, $B_T$, or a combination thereof, and not on the nature or geometry of the PCs used to obtain the required minimum $J_C$, $B_T$. In other words, it was concluded that a GFL will occur for any TFM which meets or exceeds the minimum values of $J_C$ and $B_T$ required to induce the GFL (i.e., $J_C \approx 15{,}000$ A/cm²; $B_T \approx 0.5$ T) independent of the PC geometry used to obtain the $J_C$. Thus, the benefits of the GFL to various applications can be enjoyed no matter what PC geometry is used, as long as the Lorentz force is large enough.

It should be noted, however, that the above minimum values of $J_C$ and $B_T$ required for the GFL, and shown in FIG. 16, pertain to TFMs that are about 2 cm in diameter, with a 0.8 cm axial length, which are activated using the system of FIG. 1, and that variations of TFM size and activating magnet geometry also may affect the results. For such TFMs (of about a 2 cm diameter), due to the GFL, it was found that the TFMs may have a trapped magnetic field, $B_T$, ranging from about 0.6 T to about 6.0 T when activated by a magnetic field pulse ranging from about 1.2 T to about 6.6 T. Based on the above results, however, the inventors also believe that the modeled GFL appears to indicate that the GFL will occur for TFMs of any size radius, r, wherein the derivative of the Lorentz force with respect to r is equal to or larger than the derivative of the Lorentz force with respect to r at the onset for the samples used in the experiments described above.

In summary, in contradiction to accepted theory as represented by the Bean Model, the above experimental testing demonstrated that superconducting material elements with high $J_c$ and high $B_T$, and strong pinning centers, could be activated to about 87% of peak field (95% of peak flux) with a single magnetic field pulse having a magnitude substantially equal to that of the maximum trapped field of the superconducting material elements. In further contradiction to the Bean Model, it also was observed that, as the applied field was increased, the trapped field increased discontinuously, as a giant field leap (GFL) ending close to the fully activated state of the superconducting material element. Also in contradiction to the Bean Model, low points were observed during the activation at a mid-radius region of the superconducting material element.

Multiple Pulse Activation

Experiments also were conducted, using the same prototype used in EXAMPLES 1 and 2, to determine the effects of multi-pulse activation, for example, to compare the activation capabilities of a series of very short magnetic field pulses with the activation capabilities of a single magnetic field pulse. The results and conclusions of these experiments are described below.

Example 3

It was found that multi-pulsing, applied at values of $B_A$ just below the GFL did not generate a giant field leap (GFL). While the multi-pulsing did increase the trapped field slightly, in accordance with the phenomenological law disclosed in International Patent Application No. PCT/US2013/063710, it did not induce GFL. Accordingly, it was determined that multi-pulsing at values of $B_A$ above the GFL threshold may slightly increase the trapped field if it is not already maximized. For significant increases in $B_A$ above the level to achieve $B_{T,MAX}$, however, multi-pulsing may cause heating which can in turn decrease the trapped field marginally, especially at low values of r. As above, heating effects also may result in the reduction of the $B_{T,MAX}$.

An exemplary method for activating a trapped magnetic field in a superconducting material in accordance with an exemplary embodiment of the present disclosure is set forth in the following description with reference to the embodiment of FIG. 1. At least one magnetic field pulse may be generated proximate a superconducting material element 102, which can, for example, be in the form of a solid superconducting disk or other configuration. In accordance with various embodiments of the present disclosure, a trapped magnetic field in the superconducting element 102, which is substantially equal to a magnetic field generated by the at least one magnetic field pulse, is activated by the at least one magnetic field pulse. In various exemplary embodiments, the at least one magnetic field pulse is sufficient to substantially fully activate the superconducting material element 102 to a TFM. Thus, as discussed in detail above, contrary to accepted theory as represented by the Bean Model, in various embodiments, the trapped magnetic field in the superconducting element 102 may be activated to about 87% of peak field (95% of peak flux) with a single magnetic field pulse having a magnitude substantially equal to that of the maximum trapped field of the superconducting element.

In accordance with various additional embodiments, a majority, e.g., substantially all, of a magnetic field that is generated by the at least one magnetic field pulse is contained within an area that has smaller physical lateral dimensions than the superconducting material element 102. With reference to the disk shaped embodiment of FIG. 1, for example, substantially all of the magnetic field is within a diameter smaller than a diameter of the superconducting disk 102. Thus, as described above, the at least one pulsed magnetic field is applied in a localized manner to a portion of the superconducting material element 102, the majority of which is within the outer peripheral boundaries of the element 102.

In various exemplary embodiments, the superconducting material element 102 may be disposed proximate an electromagnet source, such as, for example, electromagnets 104, 106 (see FIG. 1), and the at least one magnetic field pulse may be generated by the electromagnets 104, 106. In various embodiments, for example, the electromagnets 104, 106 may generate the at least one magnetic field pulse when an electric current (via e.g., via, a pulse generator 120 and/or a capacitor 130) is run through the electromagnets 104, 106.

In various exemplary embodiments, the electromagnets 104, 106 may generate a single magnetic field pulse, such as, for example, a single magnetic field pulse having a duration ranging from about 10 ms or shorter to about 30 ms or longer. In various additional embodiments, the electromagnets 104, 106 may generate a plurality of magnetic field pulses. In various embodiments, for example, a number of magnetic field pulses generated may be selected based on a predicted amount of trapped magnetic field in the superconducting material element 102, as disclosed, for example, in International Patent Application No. PCT/US2013/063710.

As above, to keep the superconducting material element 102 cold so that the activated TFM does not lose its magnetic field, in various embodiments, the superconducting material element 102 may also be cooled to maintain a temperature sufficient to maintain activation of the superconducting material element 102. In various embodiments, for example, the superconducting material element 102 may be cooled by a cryostat 110, which houses the superconducting material element 102 and the electromagnets 104, 106, or by an enclosed volume of liquid nitrogen maintained at below atmospheric pressure in order to reduce its temperature, as described above.

Figure 17:
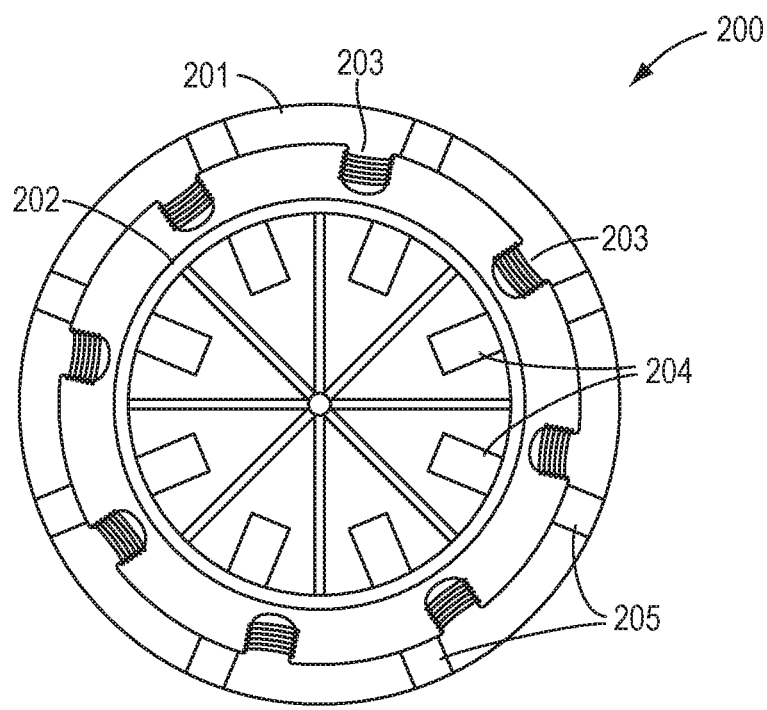
FIG. 17 is a schematic view of an exemplary embodiment of a magnetic motor in accordance with the present disclosure.

Systems and methods for activating TFMs as disclosed herein have numerous applications, including, for example, magnetic drive devices, such as, for example, magnetic motors, which in accordance with the present disclosure may be used in various industrial applications with which those of ordinary skill in the art are familiar. Such applications may include, but are not limited to, hydraulic pumps, drills, and various additional rotating drive shafts, such as, for example, a top-drive mechanism used in the oil and gas industry. FIG. 17 illustrates one exemplary embodiment of a magnetic motor 200 in accordance with the present disclosure. As shown in FIG. 17, the motor 200 includes a stator 201 and a rotor 202. The stator 201 has teeth 203 that are wound with a current carrying wire, which is configured to provide power to drive the motor 200. The rotor 202 includes at least one TFM assembly, eight TFM assemblies 204 being shown in the embodiment of FIG. 17. As illustrated in the enlarged view of FIG. 18, each TFM assembly 204 includes a TFM 206 and a first electromagnet 208 (e.g., a first half of a split coil electromagnet), which is used to activate the TFM. As shown in FIG. 17, the stator 201 includes at least one second electromagnet (e.g., a second half of a split coil electromagnet), eight electromagnets 205 being shown in the embodiment of FIG. 17. Accordingly, to activate each TFM 206, each second electromagnet 205 is aligned with a TFM 206 (i.e., such that the TFM 206 is positioned between the electromagnets 205 and 208) and then pulsed.

Figure 18:
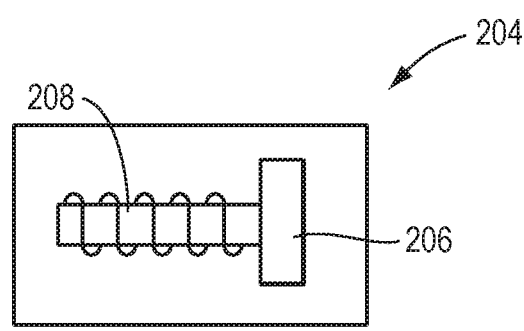
FIG. 18 is an enlarged view of an exemplary embodiment of a TFM assembly used in the motor of FIG. 17.

Magnetic motors utilizing the TFM systems described herein may, therefore, provide compact yet robust magnetic motors, which provide for onboard, or in situ, activation and/or reactivation of TFMs. Such systems may, for example, be particularly beneficial in operating industrial rotary equipment located in challenging and/or inaccessible environments, such as, for example, on oil rigs, in which size constraints often limit the power output of conventional permanent magnet motors. Those of ordinary skill in the art would understand, however, that the permanent magnet motor illustrated in FIGS. 17 and 18 is exemplary only and intended to illustrate one application of the systems and methods for activating TFMs disclosed herein. Accordingly, the systems and methods of the present disclosure may be utilized in various types and/or configurations of magnetic motors, as well as in various other types of applications, including, but not limited to, levitating bearings, particle beam bending and focusing, x-ray and magnetic field devices, magnetic particle separation, separation of red blood cells, and/or water purification, without departing from the scope of the present disclosure and claims.

Various exemplary embodiments have been described in detail above, however, those skilled in the art will readily appreciate that many modifications are possible in the example embodiments without materially departing from this disclosure. Accordingly, all such modifications are intended to be included within the scope of this disclosure as defined in the following claims.

It is to be understood that the various embodiments shown and described herein are to be taken as exemplary. Elements and materials, and arrangements of those elements and materials, may be substituted for those illustrated and described herein, and portions may be reversed, all as would be apparent to one skilled in the art after having the benefit of the description herein. Changes may be made in the elements described herein without departing from the spirit and scope of the present disclosure and following claims, including their equivalents.

Those having ordinary skill in the art will recognize that various modifications may be made to the configuration and methodology of the exemplary embodiments disclosed herein without departing from the scope of the present teachings. By way of example only, the cross-sectional shapes and relative sizes of the superconducting material elements and electromagnets may be modified and a variety of cross-sectional configurations may be utilized, including, for example, circular or oval cross-sectional shapes.

Those having ordinary skill in the art also will appreciate that various features disclosed with respect to one exemplary embodiment herein may be used in combination with other exemplary embodiments with appropriate modifications, even if such combinations are not explicitly disclosed herein.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the written description and claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. As used herein, the term "include" and its grammatical variants are intended to be non-limiting, such that recitation of items in a list is not to the exclusion of other like items that can be substituted or added to the listed items.

It will be apparent to those skilled in the art that various modifications and variations can be made to the systems and methods of the present disclosure without departing from the scope the present disclosure and appended claims. Other embodiments of the disclosure will be apparent to those skilled in the art from consideration of the specification and practice of the disclosure disclosed herein. It is intended that the specification and examples be considered as exemplary only.

What is claimed is:

1. A system for activating trapped field magnets in a superconducting material, the system comprising:
   a superconducting material element; and
   an electromagnet source disposed proximate the superconducting material element;
   wherein the electromagnet source is configured to produce a magnetic field pulse including a single magnetic field pulse that is sufficient to activate the superconducting material element, and
   wherein the superconducting material element is configured to retain a trapped magnetic field that is substantially equal to a magnetic field generated by the single magnetic field pulse.

2. The system of claim 1, wherein the superconducting material is a high temperature superconducting material.

3. The system of claim 2, wherein the high temperature superconducting material is a yttrium barium copper oxide.

4. The system of claim 1, wherein the superconducting material element includes pinning centers.

5. The system of claim 4, wherein the pinning centers comprise broken columnar pinning centers.

6. The system of claim 5, wherein the broken columnar pinning centers are formed by high-energy ions emitted by uranium fission.

7. The system of claim 4, wherein the pinning centers comprise point pinning centers.

8. The system of claim 1, wherein the superconducting element has a current density greater than or equal to about 15,000 A/cm$^2$.

9. The system of claim 1, wherein the superconducting material element is in the shape of a disk.

10. The system of claim 9, wherein substantially all of the magnetic field generated by the magnetic field pulse is within a diameter smaller than a diameter of the disk of superconducting material.

11. The system of claim 9, wherein the electromagnet source comprises a pair of electromagnets, and wherein the disk of superconducting material is disposed between the electromagnets.

12. The system of claim 11, wherein each electromagnet comprises a wire-wound split field electromagnet with a ferromagnetic material core.

13. The system of claim 1, wherein a temperature of the superconducting material element is sufficient to maintain activation of the superconducting material element.

14. The system of claim 1, further comprising a cryostat, in which the superconducting material element and electromagnetic source are disposed.

15. The system of claim 14, wherein the cryostat is a closed system operated at below atmospheric pressure.

16. The system of claim 1, further comprising an evaporated cold gas of a low temperature liquid in which the superconducting material element is disposed.

17. The system of claim 1, wherein, during activation of the superconducting material element, the superconducting material element is configured to undergo a large, discontinuous field increase.

18. The system of claim 17, wherein the large, discontinuous field increase ends at a trapped magnetic field that is close to a maximum trapped field of the superconducting material element.

19. A method for activating a trapped magnetic field in a superconducting material, the method comprising:
   generating a single magnetic field pulse proximate a superconducting material element,
   wherein the single magnetic field pulse activates a trapped magnetic field in the superconducting material element that is substantially equal to a magnetic field generated by the single magnetic field pulse.

20. The method of claim 19, further comprising varying a $U^{235}$ content of the superconducting material element and exposing the superconducting element to neutron irradiation.

21. The method of claim 20, wherein varying the $U^{235}$ content comprises varying the current density of the superconducting material element.

22. The method of claim 19, wherein generating the single magnetic field pulse comprises generating the single magnetic field pulse with an electromagnet source.

23. The method of claim 22, wherein generating the single magnetic field pulse comprises running an electric current through the electromagnet source to generate the single magnetic field pulse.

24. The method of claim 19, wherein generating the single magnetic field pulse fully activates the superconducting material element to a trapped field magnet.

25. The method of claim 19, wherein substantially all of a magnetic field generated by the single magnetic field pulse is contained within an area that has smaller physical lateral dimensions than the superconducting material element.

26. The method of claim 19, further comprising maintaining the superconducting material element at a temperature sufficient to maintain activation of the superconducting material element.

27. A trapped field magnet comprising:
   a superconducting material element comprising:
   a trapped magnetic field generated by a single magnetic field pulse sufficient to activate the superconducting material element, wherein the trapped magnetic field is substantially equal to a magnetic field generated by the single magnetic field pulse, and
   a plurality of pinning mechanisms configured to raise a current density of the superconducting material element above a threshold current density.

28. The magnet of claim 27, wherein the threshold current density is about 15,000 A/cm$^2$.

* * * * *